(12) United States Patent
Kawahara et al.

(10) Patent No.: US 7,645,975 B2
(45) Date of Patent: Jan. 12, 2010

(54) SPATIAL INFORMATION DETECTING DEVICE

(75) Inventors: Hideki Kawahara, Kyotanabe (JP); Motoo Ikari, Kyoto (JP); Kenichi Hagio, Toyonaka (JP); Eiji Nakamoto, Hirakata (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 475 days.

(21) Appl. No.: 10/598,274

(22) PCT Filed: Oct. 24, 2005

(86) PCT No.: PCT/JP2005/019516

§ 371 (c)(1),
(2), (4) Date: Aug. 23, 2006

(87) PCT Pub. No.: WO2006/046519

PCT Pub. Date: May 4, 2006

(65) Prior Publication Data

US 2007/0146539 A1    Jun. 28, 2007

(30) Foreign Application Priority Data

Oct. 25, 2004 (JP) ............... 2004-310012
Nov. 30, 2004 (JP) ............... 2004-347712

(51) Int. Cl.
*H01L 27/00* (2006.01)
*G01N 21/86* (2006.01)
*H04N 5/222* (2006.01)

(52) U.S. Cl. ............... 250/208.1; 250/559.38; 348/370

(58) Field of Classification Search ............... 250/208.1, 250/214.1, 201.9, 203.2, 227.18, 227.23, 250/231.16, 559.38, 559.4, 221, 559.44, 250/222.1, 214 R, 206.1; 348/370, 371, 348/294, 297; 257/431, 445, 448; 356/3.06, 356/5.01, 5.1, 222, 375

See application file for complete search history.

(56) References Cited

U.S. PATENT DOCUMENTS 5,856,667 A * 1/1999 Spirig et al. ............. 250/208.1

(Continued)

FOREIGN PATENT DOCUMENTS

EP    1102324    5/2001

(Continued)

OTHER PUBLICATIONS

English Language Abstract of JP 2003-058888.

(Continued)

*Primary Examiner*—Georgia Y Epps
*Assistant Examiner*—Don Williams
(74) *Attorney, Agent, or Firm*—Greenblum & Bernstein, P.L.C.

(57) ABSTRACT

A spatial information detecting device for accurately detecting information of a target space is provided. This device has photoelectric converters for receiving a reflection light from the space, in which a flashing light is being irradiated, a charge storage portion formed in each of the photoelectric converters by applying a control voltage to electrodes on each of the photoelectric converters, a controller for controlling the number of electrodes, to which the control voltage is applied, such that an area of the charge storage portion changes based on a flash cycle of the flashing light, and an amplitude-image generator for generating an amplitude image having pixel values, each of which is provided by a difference between electric charges collected in a lighting period of the flashing light by a charge storage portion and the electric charges collected in a non-lighting period of the flashing light by another charge storage portion.

16 Claims, 11 Drawing Sheets

U.S. PATENT DOCUMENTS

| | | |
|---|---|---|
| 5,982,912 A | 11/1999 | Fukui et al. |
| 7,119,350 B2 * | 10/2006 | Hashimoto et al. ..... 250/559.38 |
| 2004/0195493 A1 | 10/2004 | Hashimoto et al. |

FOREIGN PATENT DOCUMENTS

| | | |
|---|---|---|
| JP | 5-137060 | 6/1993 |
| JP | 7-270546 | 10/1995 |
| JP | 9-230225 | 9/1997 |
| JP | 9-251534 | 9/1997 |
| JP | 11-298801 | 10/1999 |
| JP | 2001-148808 | 5/2001 |
| JP | 2003-058888 | 2/2003 |
| JP | 2003-244532 | 8/2003 |
| WO | 2004/090994 | 10/2004 |

OTHER PUBLICATIONS

English Language Abstract of JP 11-298801.
English language Abstract of JP 2003-244532, Aug. 29, 2003.
English language Abstract of JP 7-270546, Oct. 20, 1995.
English language Abstract of JP 5-137060, Jun. 1, 1993.
English language Abstract of JP 9-230225, Sep. 5, 1997.

* cited by examiner

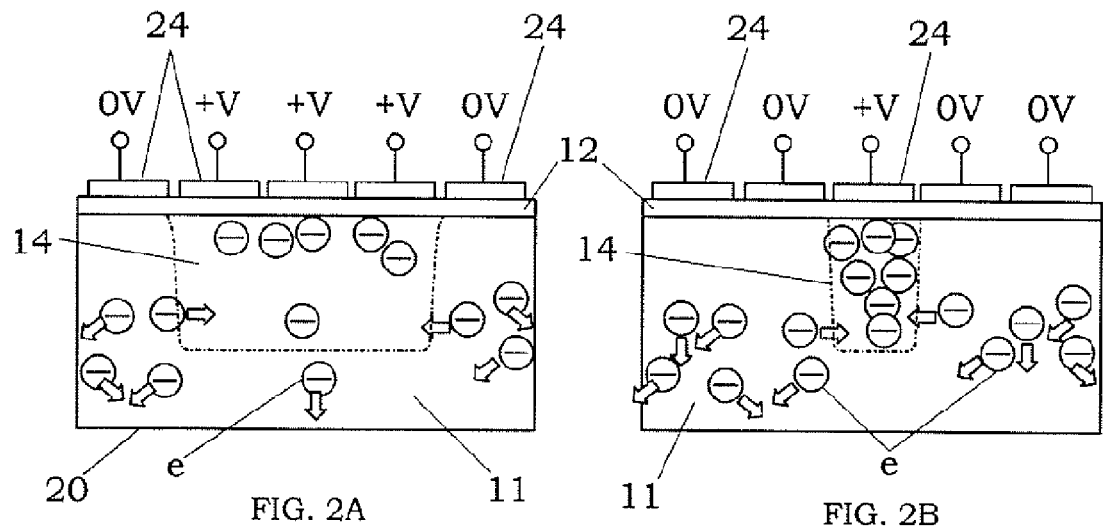
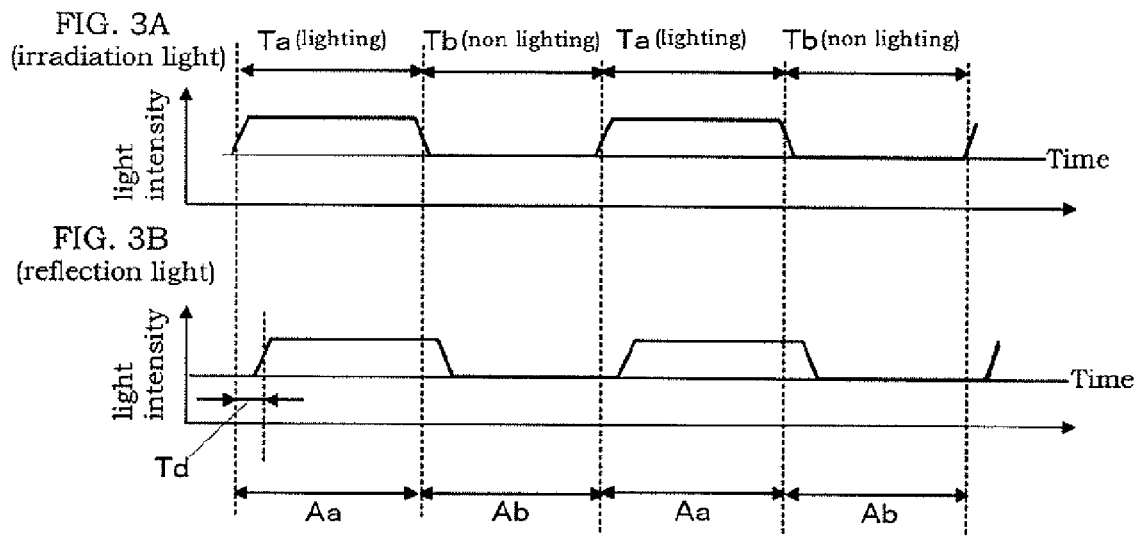
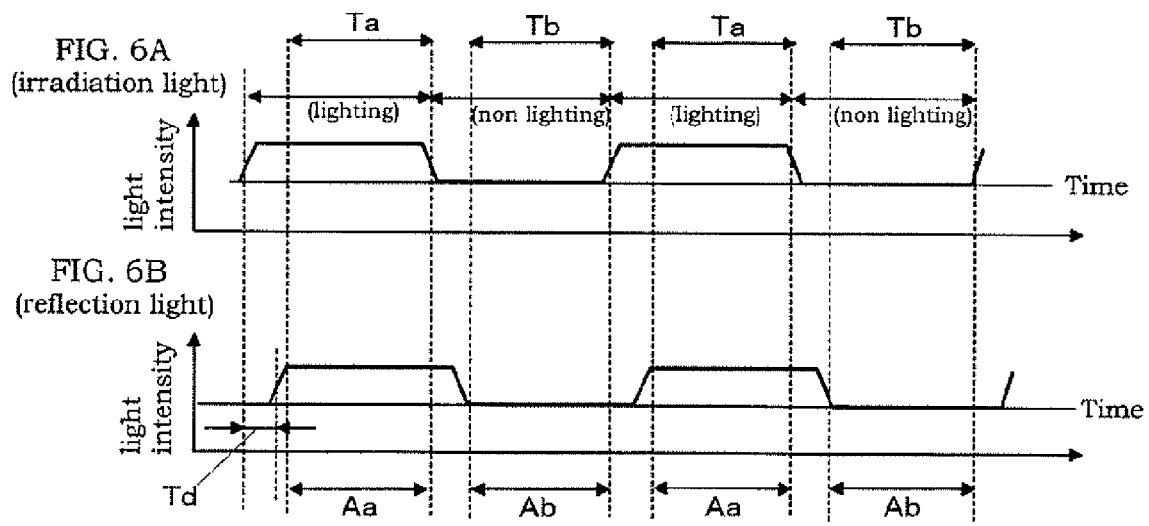

| p1 | p2 | p3 |
|----|----|----|
| p4 | p5 | p6 |
| p7 | p8 | p9 |
FIG. 11A
| a | b | c |
|---|---|---|
| d | e | f |
| g | h | i |
FIG. 11B
FIG. 12A
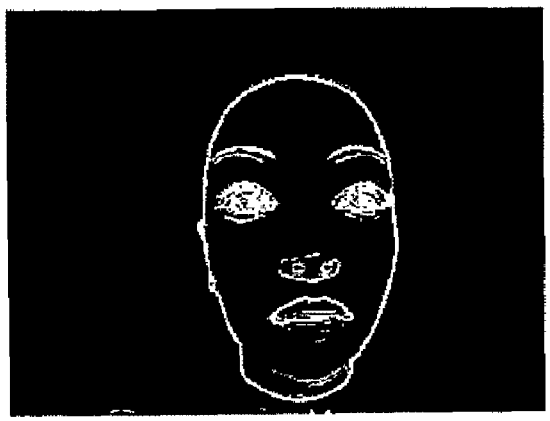
FIG. 12B
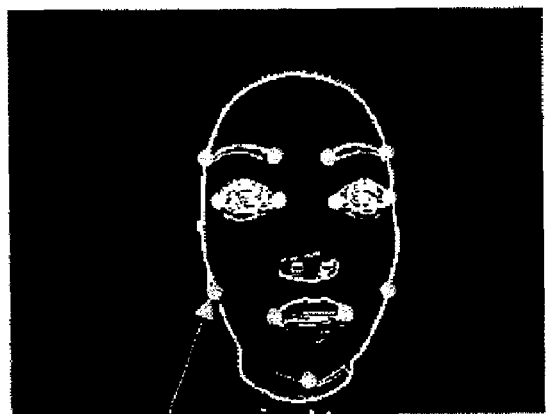
FIG. 12C

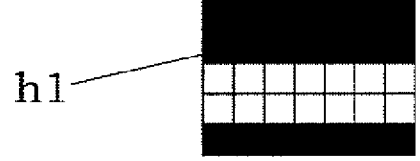
h1
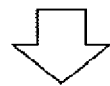
The numbers of ▪ ▪ ▪ ☐ are counted.
21  14  0  14
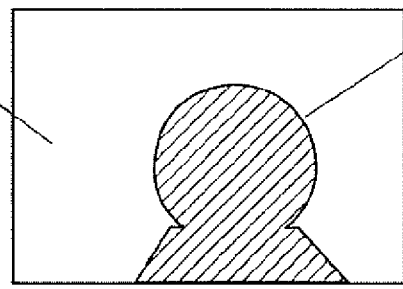
FIG. 15A
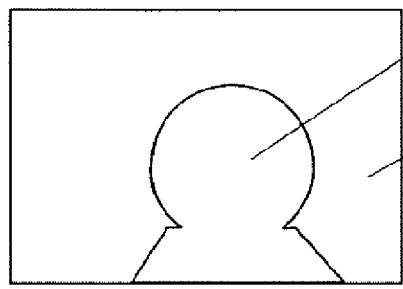
FIG. 15B
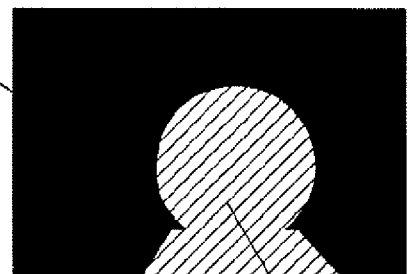
FIG. 15C
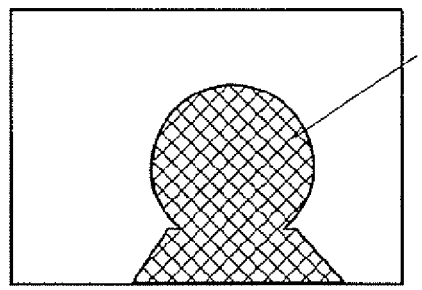
FIG. 15D

SPATIAL INFORMATION DETECTING DEVICE

TECHNICAL FIELD

The present invention relates to a spatial information detecting device for detecting information about a target space by receiving a reflection light from the target space, into which an intensity-modulated light is being irradiated.

BACKGROUND ART

In recent years, a device of detecting spatial information such as the presence of an object in a target space, or the outline and shape of the object by irradiating a light into the target space, and receiving a reflection light from the target space has been practically utilized in various technical fields of, for example, realizing quality control in factory automation, security system at airport and station, and an TV interphone system for household use.

For example, Japanese Patent Early Publication [kokai] No. 2001-148808 discloses a solid-state image pickup device, which has the capability of providing a clear image of an object by removing the influence of environmental light. This solid-state image pickup device has two CCDs for storing electric charges with respect to one photodiode. Electric charges received in a lighting period and a non-lighting period of a light emitting portion are stored in the respective CCDS, and then a difference signal therebetween is used to cancel the influence of environmental light.

In addition, International Publication No. 2004/090994 discloses a spatial information detecting device having an excellent S/N ratio and an increased aperture ratio. This spatial information detecting device is provided with a photoelectric converter for generating amounts of electric charges corresponding to an intensity of received light, a charge collection region formed in the photoelectric converter by applying a control voltage to an electrode on the photoelectric converter to collect the electric charges generated in the photoelectric converter, a charge ejecting portion for outputting the electric charges from the charge collection region, and a sensitivity controller for controlling the control voltage to change the size of the charge collection region.

However, the conventional devices described above still have plenty of room for improvement from the viewpoints of improving the detection efficiency of the spatial information, developing a method of effectively evaluating the detected information, improving the operation stability of the detecting device under special circumstances that the received light output is saturated, and simplifying the complex structure of the conventional detecting device, in addition to removing the influence of environmental light.

SUMMARY OF THE INVENTION

Therefore, a primary concern of the present invention is to provide a spatial information detecting device, which has the capability of accurately detecting spatial information by use of a relatively simple device structure, and effectively reducing the influence of environmental light.

That is, the spatial information detecting device of the present invention comprises:

at least two photoelectric converters configured to receive a light from a target space, into which a light intensity-modulated at a modulation signal having a predetermined frequency is being irradiated, and generate an electric output corresponding to an intensity of received light;

at least one electrode formed on each of the photoelectric converters;

a charge storage portion formed in each of the photoelectric converters by applying a control voltage to the at least one electrode to collect at least part of electric charges generated in the photoelectric converter;

a controller configured to control the control voltage applied to the at least one electrode such that an area of the charge storage portion in one of two different phase periods of the modulation signal is different from the area of the charge storage portion in the other phase period of the modulation signal;

a charge ejecting portion configured to output the electric charges collected in the charge storage portion; and an evaluation unit configured to evaluate the target space according to a difference between the electric charges collected in the one of two different phase periods by the charge storage portion formed in one of the at least two photoelectric converters, and the electric charges collected in the other phase period by the charge storage portion formed in the other one of the at least two photoelectric converters.

According to the present invention, since the area of the charge storage portion formed in the photoelectric converter can be changed by controlling the control voltage applied to the electrodes, it is possible to provide the spatial information detecting device with a relatively simple structure, as compared with the case of using a shutter and an aperture for adjusting an amount of light incident on the photoelectric converter. In addition, as compared with the case of collecting electric charges in each of two different phase periods of the modulation signal by use of a single photoelectric converter, and then performing an evaluation, it is possible to more efficiently perform the detection and evaluation of the spatial information because the electric charges collected in the two different phase periods of the modulation signal can be provided in a lump sum, and then evaluated.

In a preferred embodiment of the present invention, at least two photoelectric converters receive light from the target space, into which a flashing light is being irradiated. The controller controls the control voltage applied to at least one electrode such that the area of the charge storage portion in a lighting period of the flashing light is different form the area of the charge storage portion in a non-lighting period of the flashing light. The evaluation unit evaluates the target space by use of a difference between the electric charges collected in the lighting period of the flashing light by the charge storage portion formed in one of the photoelectric converters, and the electric charges collected in the non-lighting period of the flashing light by said charge stored portion formed in the other one of the photoelectric converters. In this case, it is preferred that the controller controls the control voltage such that the area of the charge storage portion formed in each of the photoelectric converters changes in synchronization with a flash timing of the flashing light.

In addition, it is preferred that the controller controls the control voltage such that the area of the charge storage portion formed in one of the photoelectric converters is larger in the lighting period than the non-lighting period, and the area of the charge storage portion formed in the other one of the photoelectric converters is larger in the non-lighting period than the lighting period.

In addition, it is preferred that the controller controls the control voltage such that the area of the charge storage portion formed in the lighting period in one of the photoelectric converters is equal to the area of the charge storage portion formed in the non-lighting period in the other one of the photoelectric converters.

It is preferred that the evaluation unit of the aforementioned spatial information detecting device comprises an amplitude-image generator configured to generate an amplitude image having pixel values, each of which is provided by the difference described above. In this case, it is possible to obtain an image of an emphasized object against the background, especially the image of the object not including the background. Therefore, it is effective to recognize the shape and the size of the object.

In addition to the amplitude-image generator, the spatial information detecting device preferably comprises a gray-image generator configured to generate a gray image having pixel values, each of which is provided by amounts of electric charges collected in one of a lighting period and a non-lighting period of a flashing light by the charge storage portion, or an average of the amounts of electric charges collected in both of the lighting period and the non-lighting periods by the charge storage portion.

According to this structure, it is possible to obtain the gray image in consideration of light amounts provided from the target space besides the amplitude image. In addition, since each of the pixel values in the amplitude image and each of the pixel values in the gray image are associated with the same position in the target space, it is possible to remove an area of the object, and easily generate an image of only the background. Furthermore, since the gray image can be generated by use of the received light output provided from the charge ejecting portion to obtain the amplitude image, it is possible to efficiently obtain both of the gray image and the amplitude image.

The spatial information detecting device according to another preferred embodiment of the present invention further comprises a characteristic-amount extracting portion configured to extract a characteristic amount of an object in the target space according to the amplitude image generated by the amplitude-image generator, a similarity calculating portion configured to calculate a degree of similarity by comparing the characteristic amount with a previously prepared template, and a target recognizing portion configured to recognize the object as a target object corresponding to the template when the degree of similarity is not smaller than a predetermined value.

When the object to be detected is a face, it is preferred that the spatial information detecting device further comprises a template storing portion configured to store a face template previously prepared according to characteristic amounts of the face, and the object recognizing portion recognizes the face as a person corresponding to the face template when the degree of similarity between the characteristic amount extracted by the characteristic-amount extracting portion and the face template stored in the template storing portion In this case, there is an advantage that the face recognition can be performed with reliability without the influence of environmental light.

The spatial information detecting device according to a further preferred embodiment of the present invention comprises a saturation determining portion configured to compare a predetermined threshold value with the amounts of electric charges collected in at least one of the two different phase periods of the modulation signal by the charge storage portion, and an output regulating portion configured to regulate an electric output corresponding to the intensity of received light according to the comparison result.

According to this structure, when it is determined by the saturation determining portion that the amounts of electric charges are greater than the threshold value, i.e., the received light output has been saturated, the output regulating portion lowers the electric output of the photoelectric converter to reduce the received light output. In the case of evaluating the spatial information according to the difference of the received light outputs, when one of the received light outputs used to determine the difference is saturated, it becomes difficult to obtain significant spatial information. In particular, when both of the received light outputs are saturated, the difference is zero. As a result, the target can not be distinguished form the background. However, according to the present invention, even when the spatial information detecting device is used in the presence of increased environmental light such as outdoor, the saturation state of the received light output is determined by the saturation determining portion, and the output regulating portion prevents the occurrence of saturation of the received light output according to the saturation determination result. Therefore, it is possible to stably extract the significant spatial information from the difference of the received light outputs even under environmental conditions that the saturation of the received light output occurs. As described later, it is particularly preferred that the output regulating portion controls at least one of the photoelectric converter, the light source, and a light receiving optical system to prevent the saturation of the received light output.

In addition, it is preferred that the spatial information detecting device of the present invention comprises a saturation determining portion configured to compare a predetermined threshold value with the amounts of electric charges collected in at least one of the two different phase periods of the modulation signal by the charge storage portion, and the evaluation unit evaluates the target space by use of a preset difference value in place of the difference described above. In this case, by using a maximum value of the difference to be permitted as the preset difference value, it is possible to distinguish a saturated region of the received light output in the amplitude image from the background.

Moreover, it is preferred that the spatial information detecting device of the present invention comprises a saturation determining portion configured to compare a predetermined threshold value with amounts of electric charges collected in each of the two different phase periods of the modulation signal over a storing time period corresponding to a plurality of cycles of the modulation signal, and an output regulating portion configured to regulate the electric output corresponding to the intensity of received light by changing the storing time period according to the comparison result. In this case, when the received light amount increases, it is possible to reduce the storing time period, and therefore obtain improved response. On the other hand, when the received light amount decreases, the storing time period is prolonged, but it is effective to suppress the noise level. The storing time period is equal to a product of the duration of each of the phase periods and the number of cycles (the number of charge collecting operations). Alternatively, it is also preferred that the saturation determining portion is configured to compare a predetermined threshold value with the amount of electric charges collected in each of the two different phase periods of the modulation signal over one cycle of the modulation signal, and the output regulating portion is configured to regulate the electric output corresponding to the intensity of received light by changing a duration of at least one of the two different phase periods according to the comparison result.

Additional features and effects of the present invention will be clearly understood from the following preferred embodiments of the present invention.

BRIEF EXPLANATION OF THE DRAWINGS

FIGS. 2A and 2B are operation explanatory views of a light receiving element used in the spatial information detecting device.

FIGS. 3A and 3B are diagrams respectively showing a flash cycle of a light source and a period of receiving a reflection light.

FIGS. 6A and 6B are diagrams respectively showing a flash cycle of a light source and a period of receiving a reflection light.

FIGS. 11A and 11B are explanatory views showing a method of determining the amplitude-gradient directional image from the amplitude image.

FIGS. 12A to 12C are explanatory views showing a method of extracting characteristic points of a face as an object to be detected.

FIGS. 15A to 15D are schematic diagrams showing images obtained by the spatial information detecting device of the third embodiment.

BEST MODE FOR CARRYING OUT THE INVENTION

First Embodiment

Figure 1:
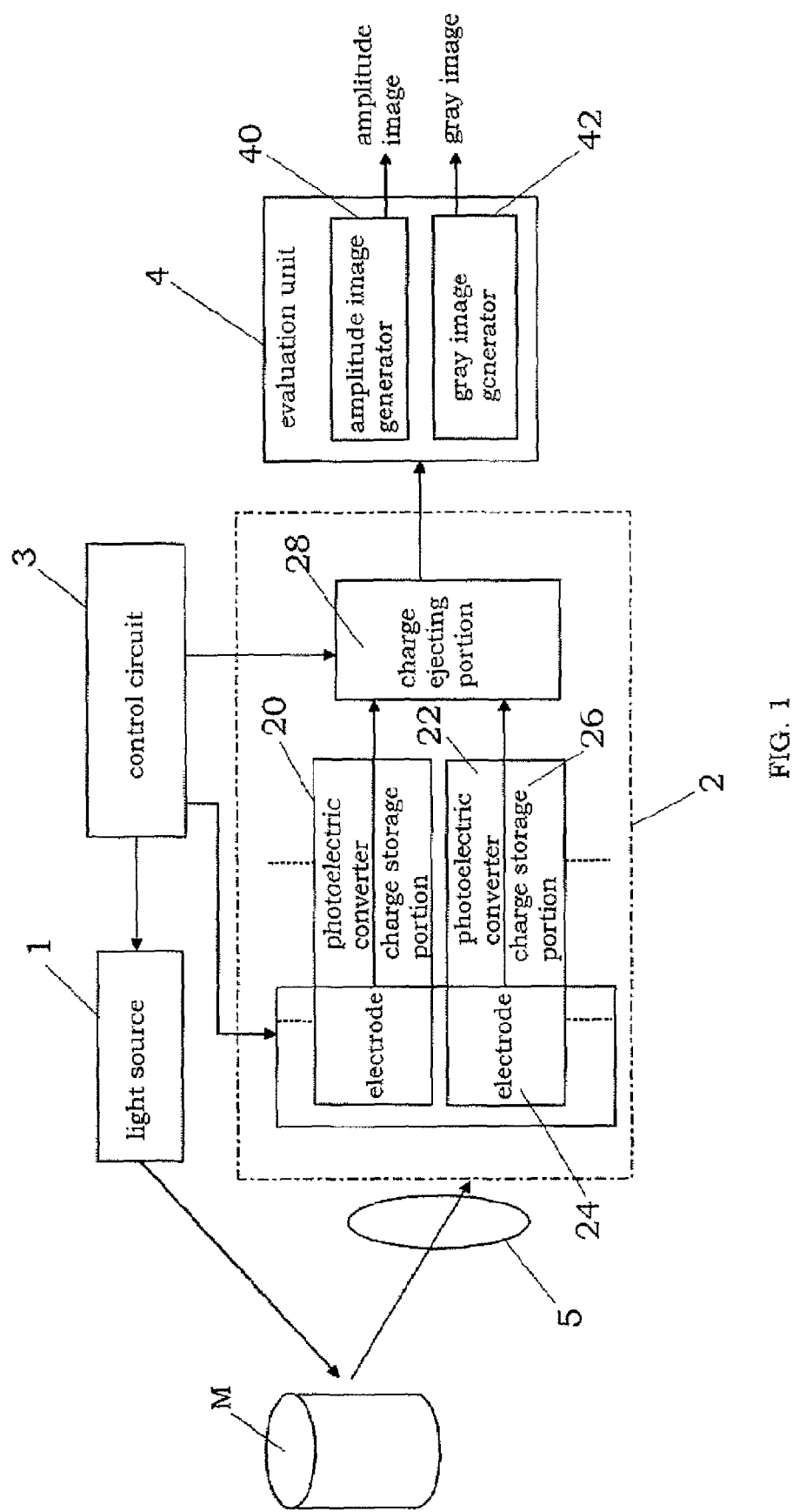
FIG. 1 is a block diagram of a spatial information detecting device according to a first embodiment of the present invention.

As shown in FIG. 1, a spatial information detecting device of the first embodiment of the present invention is mainly composed of a light source 1 for irradiating a flashing light into a target space, image sensor 2 formed by arranging a plurality of light receiving elements 20 for receiving light from the target space on a semiconductor substrate, control circuit 3 for controlling the light source 1 and the image sensor 2, evaluation unit 4 for evaluating the target space from an output of the image sensor 2, which comprises an amplitude image generator 40 for generating an amplitude image and a gray image generator 42 for generating a gray image. In the drawings, the numeral 5 designates a light receiving optical system, through which light provided from the target space is incident on the image sensor 2.

As the light source 1, for example, it is possible to use an array formed by arranging a plurality of light emitting diodes (LED) on a plane, or a combination of a semiconductor laser and a divergent tens. As the light irradiated from the light source 1, infrared light or visible light can be used. In the case of using the infrared light, since the light source 1 can be operated at night without being noticed, it is suitable for the purpose of crime prevention such as security camera. On the other hand, when using the visible light, it is possible to obtain an image close to the observation by the human eye. The light source 1 is operated by a modulation signal having a predetermined frequency output from the control circuit 3. In the present embodiment, a square wave is used as the modulation signal. The frequency is selected from a range of 10 to 100 kHz. A duty ratio is 50%. Therefore, the light source 1 provides a flashing light that a lighting period has the same duration as a non-lighting period, and they are alternately repeated at a cycle of 10 to 100 μs. This flash cycle corresponds to a short cycle that cannot be recognized by the human eye. The frequency and the duty ratio are not limited to the above values. According to spatial information to be detected and the kind of the light source 1, the frequency and the duty ratio can be suitably determined.

Each of the light receiving elements 20 of the image sensor 2 has a photoelectric converter 22 for receiving light from the target space and generating an electric output corresponding to an intensity of the received light, a plurality of electrodes 24 formed on the photoelectric converter 22, and a charge storage portion 26 induced in the photoelectric converter by applying a control voltage to the electrode(s) 24 in order to collect at least part of electric charges generated in the photoelectric converter, and a charge ejecting portion 28 for outputting the electric charges from the charge storage portion 26. For example, as shown in FIGS. 2A and 2B, each of the light receiving elements 20 is provided with a semiconductor layer 11 made of a solid material such as a doped silicon, an insulating film 12 such as an oxide film formed on the entire general surface of the semiconductor layer 11, and electrodes 24 formed on the semiconductor layer 11 through the insulating film 12. This kind of light receiving element is well known as MIS device. However, the light receiving element 20 of this embodiment is different from the conventional MIS device in that the plurality of electrodes 24 are formed in a region that functions as a single light receiving element 20. The insulating film 12 and the electrodes 24 are made of a material having light transmittance. When the light is incident on the semiconductor layer 11 through the insulating film 12, electric charges are generated in the semiconductor layer 11. That is, a light receiving surface of the light receiving element 20 is provided by the general surface (top surface) of the semiconductor layer 11 shown in FIGS. 2A and 2B. In this figure, a conductivity type of the semiconductor layer 11 is n-type. Therefore, the electric charges generated by light irradiation are electrons (e). In the above-described light receiving element 20, when a positive control voltage "(+V)" is applied to the electrode(s) 24, a potential well 14 (depletion layer) for collecting electrons (e) is formed at a region corresponding to the electrodes 24 in the semiconductor layer 11. That is, when the light is irradiated to the semiconductor layer 11 under the condition that the control voltage is applied to the electrode(s) 24 to form the potential well 14, parts of electrons (e) generated in the vicinity of the potential well 14 are captured in the potential well 14, and the balance of the generated electrons disappear due to recombination with holes at a deep portion of the semiconductor layer 11. The electrons (e) generated at locations away from the potential well 14 also disappear due to the recombination at the deep portion of the semiconductor layer 11. Thus, when the light is irradiated, the semiconductor layer 11 functions as the photoelectric converter 22 for generating the electric charges, and the potential well 14 functions as the charge storage portion 26 for collecting and holding the electric charges.

In addition, since the potential well 14 is formed at the region corresponding to the electrode(s) 24, to which the control voltage is applied, it is possible to control a size of the potential well 14 along the general surface of the semiconductor layer 11 by changing the number of the electrodes, to which the control voltage is applied. A ratio of electric charges collected in the potential well 14 relative to the electric charges generated in the semiconductor layer 11 increases as the size (area) of the potential well 14 becomes larger. In the present invention, as described later, since the electric charges collected in the potential well 14 are used, an improvement in sensitivity can be achieved by increasing the size of the potential well 14. In brief, the size of the potential well 14 acted as the charge storage portion 26 can be controlled by changing the control voltage applied to the electrode(s) 24, so that the sensitivity of the photoelectric converter 22 is adjustable.

For example, in the case of using the light receiving element 20 having five electrodes 24, when the control voltage (+V) is applied to inner three electrodes 24, and is not applied to outer two electrodes 24 (0V), as shown in FIG. 2A, the size of the potential well 14 (i.e., the charge storage portion) along the light receiving surface becomes larger than the case that the control voltage (+V) is applied to only the center electrode 24, and is not applied to the remaining four electrodes 24 (0V), as shown in FIG. 2B. Therefore, when the same light amount is irradiated, the amounts of electric charges collected in the potential well shown in FIG. 2A are larger than the amounts of electric charges collected in the potential well shown in FIG. 2B. This means that the photoelectric converter has higher sensitivity.

The image sensor 2 can be formed by disposing the light receiving elements 20 each having the above-described structure on lattice points of a two-dimensional square lattice pattern prepared on a single semiconductor substrate. For example, a matrix array of 100×100 light receiving elements 20 can be used. In addition, when the semiconductor layer 11 is integrally and successively formed in each of columns in a vertical direction of the matrix array of the light receiving elements 20, and the electrodes 24 are disposed adjacent to each other in the vertical direction, the semiconductor layer 11 can be used as a transfer channel for transferring the electric charges in the vertical direction. The image sensor 2 also has a horizontal transferring portion formed in the semiconductor substrate, and comprising a CCD for receiving the electric charges from an end of each of the columns extending in the vertical direction of the semiconductor layer 11, and then transferring the electric charges in the horizontal direction.

To output the electric charges from the potential well 14 (i.e., the charge storage portion 26) in each of the light receiving elements 20, it is possible to use the same technology as conventional CCD. That is, after the electric charges are collected in the potential well 14, the electric charges collected in the potential well 14 are transferred by controlling a pattern of applying the control voltage to the electrodes 24, so that the electric charges can be output from another electrode (not shown) formed on the semiconductor layer 11. The means for transferring the electric charges may have a substantially same structure as a frame transfer CCD or an interline transfer CCD. For example, when it has the same structure as the frame transfer CCD, the electric charges can be transferred in a left or right direction of FIG. 2A or 2B by clanging the shape of the potential well 14. In addition, when it has the same structure as the interline transfer CCD, CCDs are formed along the left and right directions of FIG. 2A or 2B. The electric charges are sent from the potential well 14 to the CCDs, and then transferred in the left and right directions of FIG. 2A or 2B by the CCDs.

In addition, when the charge ejecting portion 28 has the same structure as the frame transfer CCD, the electric charges are transferred by controlling the pattern of applying the control voltage to the electrodes 24. In this case, the control voltage applied to the electrodes 24 can be controlled such that the electric charges of the charge storage portion 26 are output in a charge ejection period, which is different from a charge collection period for collecting the electric charges in the charge storage portion 26. Therefore, in the present embodiment, the electrodes 24 can be also used to transfer the electric charges, and the semiconductor layer 11 also functions as the charge ejecting portion 28.

By the way, to easily understand the image sensor 2 of the present embodiment, the functions of the light receiving element 20 are individually shown in FIG. 1 by the photoelectric converter, the charge storage portion and the charge ejecting portion. In addition, the charge ejecting portion 28 shown in FIG. 1 comprises the semiconductor layer 11 and the horizontal transfer portion described above. Moreover, the electrodes 24 are commonly used in the photoelectric converter 22, the charge storage portion 26 and the charge ejecting portion 28.

The control circuit 3 generates the control voltage to be applied to the electrode(s) 24, and controls the pattern of applying the control voltage to the electrodes, thereby adjusting the sensitivity, i.e., a ratio of the electric charges collected in the charge storage portion 26 relative to the electric charges generated in the photoelectric converter 22 by light irradiation, the timing of forming the charge storage portion 26, and the timing of outputting the electric charges from the charge storage portion 26 by the charge ejecting portion 28. That is, by controlling the pattern of applying the control voltage to the electrodes and the timing of changing the pattern, it is possible to provide the charge collection period where the electric charges are collected in the charge storage portion 26, and the charge ejection period where the electric charges are ejected from the charge storage portion 26 by the charge ejecting portion 28, then output as the received light output to the evaluation unit 4, and which is defined in a different period from the charge collection period.

The light receiving optical system 5 is formed to project the target space on the respective light-receiving elements 20 of the image sensor 2. That is, a three dimensional space corresponding to the target space is mapped on a 2-dimensional planar surface provided by the arrangement of the light receiving elements 20 of the image sensor 2 through the light receiving optical system 5. Therefore, an object M in a visual field observed from the side of the image sensor 2 through the light receiving optical system 5 can be associated with the light receiving elements 20.

Figure 10A:
FIG. 10A is an example of a gray image.
Figure 10B:
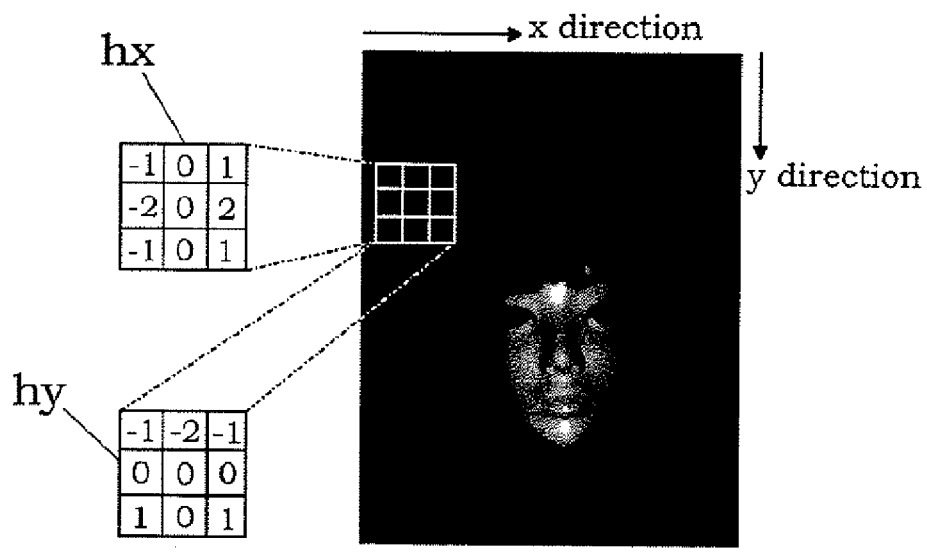
FIG. 10B is an amplitude image of FIG. 10A.

The gray image generator 42 of the evaluation unit 4 generates a gray image including the object M and the background (e.g., as shown in FIG. 10A). On the other hand, the amplitude image generator generates an amplitude image, in which the object M is emphasized against the background (e.g., as shown in FIG. 10B). These images can be used to check the shape and the size of the object M. Alternatively, it is available to determine the reflectance of the object M. The kind of spatial information to be detected by use of these images can be determined according to a structure of the evaluation unit 4.

Next, operations of the spatial information detecting device of this embodiment are explained. The light source 1 irradiates the flashing light in the target space such that lighting period and the non-lighting period are alternately repeated, as shown in FIG. 3A. In this embodiment, a duration of the lighting period "Ta" is set to be equal to the duration of the non-lighting period "Tb". That is, the duty ratio of the modulation signal is 50%. The light irradiated in the target space from the light source 1, and reflected from the object M in the target space is incident on the light receiving elements 20 with a delay time "Td" depending on distance to the object M. In this case, since the delay time "Td" is much shorter than the lighting period "Ta" or the non-lighting period "Tb", it will be negligible.

In the present embodiment, since a received light output "Aa" of the lighting period "Ta" and a received-light output "Ab" of the non-lighting period "Tb" are provided in a lump sum to the evaluation unit 4, a set of adjacent two light receiving elements 20 are regarded as one pixel. That is, one of the photoelectric converters of the adjacent two light receiving elements 20 used as one pixel is set to a high sensitive state in the lighting period "Ta" in order to collect the electric charges in the charge storage portion 26, and provide the received light output. At this time, the other photoelectric converter is set to a low sensitivity state by adjusting the control voltage applied to the electrodes 24. On the contrary, in the non-lighting period "Tb", the other photoelectric converter of the adjacent two light receiving elements 20 is set to the high sensitive state, in order to collect the electric charges in the charge storage portion 26, and provide the received light output. At this time, the one of the photoelectric converters is set to the low sensitivity state by adjusting the control voltage applied to the electrodes 24. According to this manner, the electric charges collected in the charge collection period corresponding to the lighting period "Ta" and the electric charges collected in the charge collection period corresponding to the non-lighting period "Tb" are respectively held in different charge storage portions 26 formed in the image sensor 2, and the electric charges held in both of the charge storage portions are sent in a lump sum to the evaluation unit 4 in a single charge ejection period.

Figure 4A:
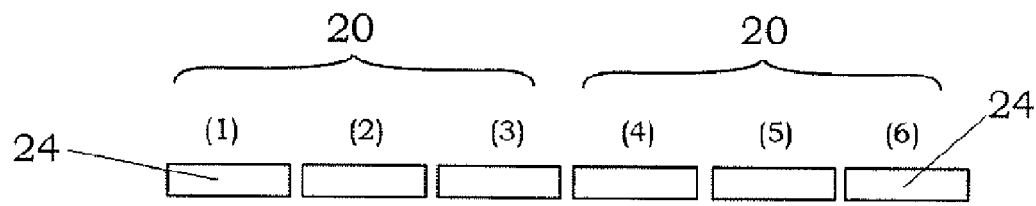
FIGS. 4A and 4B are schematic diagrams showing charge storage portions at a lighting period and a non-lighting period of the light source.
Figure 4B:
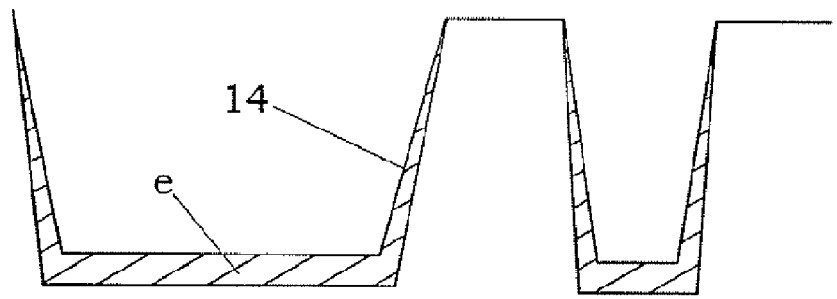

In the following explanations, each of two light receiving elements 20 used as one pixel has three electrodes. In addition, to make a distinction between the electrodes for one of the light receiving elements and the electrodes for the other light receiving element, these electrodes 24 are designated by the reference numerals (1) to (6), as shown in FIGS. 4A and 4B. That is, one of the two light receiving elements 20 has the electrodes (1) to (3), and the other light receiving element 20 has the electrodes (4) to (6). In this case, it is preferred to form an overflow drain in association with the light receiving elements 20 used as one pixel.

To control the sensitivity of the photoelectric converter 22, the number of electrodes 24, to which the control voltage is applied, is controlled to change the area of the potential well 14 on the light receiving surface. That is, in the lighting period "Ta" of the light source 1, a positive control voltage (+V) is applied to all of the electrodes (1) to (3) to obtain the area of the potential well 14 corresponding to the electrodes (1) to (3), as shown in FIG. 4A. On the other hand, in this lighting period, the positive control voltage (+V) is applied to only the center one (5) of the electrodes (4) to (6) of the other light receiving element 20 to decrease the area of the potential well 14. In this case, the region corresponding to the electrodes (1) to (3) provides the high sensitivity state of the photoelectric converter 22, and the region corresponding to the electrodes (4) to (6) provides the low sensitivity state of the photoelectric converter 22. Therefore, amounts of electric charges (electrons "e") newly generated by receiving the light at the region corresponding to the electrodes (4) to (6) are much smaller than the amounts of electric charges generated at the region corresponding to the electrodes (1) to (3). As a result, the electric charges corresponding to the received light output "Aa" are collected in the potential well 14 of the region corresponding to the electrodes (1) to (3).

In the non-lighting period "Tb" of the light source 1, a positive control voltage (+V) is applied to all of the electrodes (4) to (6) to obtain the area of the potential well 14 corresponding to the electrodes (4) to (6), as shown in FIG. 4B. In this non-lighting period, the positive control voltage (+V) is applied to only the center one (2) of the electrodes (1) to (3) of the other light receiving element 20 to decrease the area of the potential well 14. In this case, the region corresponding to the electrodes (4) to (6) provides the high sensitivity state of the photoelectric converter 22, and the region corresponding to the electrodes (1) to (3) provides the low sensitivity state of the photoelectric converter 22. Therefore, amounts of electric charges (electrons "e") newly generated by receiving the light at the region corresponding to the electrodes (1) to (3) are much smaller than the amounts of electric charges generated at the region corresponding to the electrodes (4) to (6). As a result, the electric charges corresponding to the received-light output "Ab" are collected in the potential well 14 of the region corresponding to the electrodes (4) to (6).

As described above, the electric charges corresponding to the lighting period "Ta" can be collected in the state shown in FIG. 4A, and the electric charges corresponding to the non-lighting period "Tb" can be collected in the state shown in FIG. 4B. By controlling the pattern of applying the control voltage to the electrodes such that one cycle of the states of FIGS. 4A and 4D are obtained, it is possible to obtain the received light outputs (Aa, Ab) of the lighting period "Ta" and the non-lighting period "Tb". However, when the light amount to be incident on the light receiving element 20 is not sufficiently obtained by only one cycle of the lighting period "Ta" and the non-lighting period "Tb", there is a fear that the S/N ratio of the received-light output (Aa, Ab) lowers due to the influence of shot noises caused in the light receiving element. In this case, it is preferred that after the cycle of the states of FIGS. 4A and 4B is repeated plural times to sufficiently collect the electric charges in the charge storage portions 26, the received-light outputs (Aa, Ab) are output by the charge ejecting portion 28.

After the electric charges generated in the lighting period "Ta" and the electric charges generated in the non-lighting period "Tb" are respectively collected in the charge storage portions 26 of the two light receiving elements 20 used as one pixel, the charge ejecting portion 28 sends the two kinds of received light outputs (Aa, Ab) in a lump sum to the evaluation unit 4 within the charge ejection period. This means that the two kinds of the received light outputs (Aa, Ab) can be obtained through three periods of the collection period for collecting the electric charges in the lighting period "Ta", the collection period for collecting the electric charges in the non-lighting period "Tb", and the ejection period for outputting the electric charges collected at these collection periods. To prevent a situation that electric charges other than desired electric charges are mixed in the time period with the reduced area of the charge storage portion 26, a light shielding film may be formed to cover a vicinity of the electrode 24 corresponding to the charge storage portion 26 in this time period.

In each of the states of FIGS. 4A and 4B of the present embodiment, the control voltage (+V) applied to the three electrodes (1) to (3) or (4) to (6) is set to be equal to the control voltage (+V) applied to the center electrode (2) or (5). Therefore, even when a change in area of the potential well 14 occurs, the depth of the potential well 14 can be substantially maintained constant. Therefore, the electric charges generated at the vicinity of a barrier between the potential wells 14 evenly flow in the adjacent potential wells 14.

By the way, even when the area of the potential well 14 is reduced to obtain the low sensitivity state of the photoelectric converter 22, and the electric charges collected in the potential well 14 are transferred, the electric charges are collected in the charge storage portion 26 by the light irradiation to the light receiving element 20. That is, the electric charges generated in a time period other than the high sensitivity state of the photoelectric converter 22 are mixed in the charge storage portion 26. In the present embodiment, the influence of unwanted electric charges, which are generated in the time periods of holding the electric charges of the lighting period "Ta" and the electric charges of the non-lighting period "Tb" in the charge storage portions 26, can be excluded together with components corresponding to the environmental light at the time of determining the difference, as described later. When the electric charges are held in the charge storage portion 26, and transferred from the charge storage portion 26, the photoelectric converter 22 is in the low sensitivity state. At this time, since the area of the charge storage portion 26 is reduced, the generation amounts of unwanted electric charges becomes small.

For ease of explanation, it is assumed that the amounts of electric charges collected in the potential well 14 is in proportion to the area of the potential well 14. In addition, the area of the potential well 14 is three times larger in the high sensitivity state of the photoelectric converter 22 than the low sensitivity state of the photoelectric converter 22. This means that the amounts of electric charges collected in the high sensitivity state is three times larger than the amounts of electric charges collected in the low sensitivity state.

When the amounts of electric charges collected in the potential well 14 corresponding to a single electrode in accordance with the light provided from the light source 1 are represented by (S), and the amounts of electric charges collected in accordance with the environmental light is represented by (N), total amounts of electric charges collected in the potential well 14 corresponding to the single electrode (5) is represented by (S+N), as shown in FIG. 4A. On the other hand, the amounts of electric charges collected in the potential wells corresponding to the electrodes (1) to (3) is represented by (3S+3N). Since the state of FIG. 4B corresponds to the non-lighting period "Tb", there is no electric charge collected in accordance with the light provided from the light source 1. Therefore, the amounts of electric charges collected in the potential well 14 corresponding to the electrode (2) are equal to the amounts (N) of electric charges collected in accordance with the environmental light. Similarly, the amounts of electric charges collected in the potential well 14 corresponding to the electrodes (4) to (6) are only (3N).

To generate the amplitude image in the amplitude image generator 40, a difference between lie received light output "Aa" provided by the electric charges collected in the potential well 14 of the high sensitivity state, which is formed at the region corresponding to the electrodes (1) to (3), as shown in FIG. 4A, and the received light output "Ab" provided by the electric charges collected in the potential well 14 of the high sensitivity state, which is formed at the region corresponding to the electrodes (4) to (6), as shown in FIG. 4B, is calculated, as described above. The amounts of electric charges corresponding to the received-light output "Aa" is represented by (3S+4N), which is a sum of the electric charges (3S+3N) collected in the lighting period "Ta" and the unwanted electric charges (N) collected in the potential well 14 corresponding to the electrode (2) in the state of FIG. 4A. On the other hand, the electric charges corresponding to the received light output "Ab" is represented by (S+4N), which is a sum of the electric charges (3N) collected in the non-lighting period "Tb", and the unwanted electric charges (S+N) collected in the potential well 14 corresponding to the electrode (5) in the state of FIG. 4A. By determining the difference between these received light outputs (Aa, Ab), i.e., (3S+4N)−(S+4N)=2S, it is possible to exclude the influence of the unwanted electric charges (N) originated from the environmental light, and generate the amplitude image.

Figure 5:
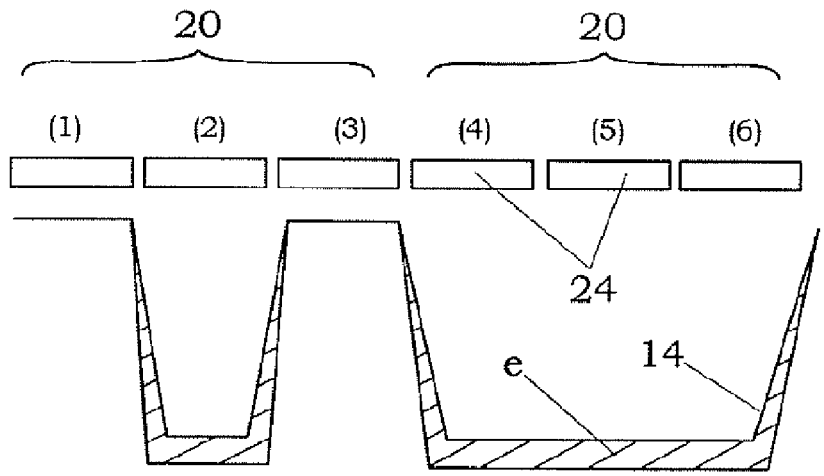
FIG. 5 is a graph showing an output of the light receiving element when the intensity of environmental light changes.

By the way, as shown by a curve E in FIG. 5, on the assumption that an intensity of the environmental light changes with time, this curve E corresponds to the intensity of light incident on the photoelectric converter 22 in the non-lighting period "Tb" of the light source 1. As a result, this corresponds to the received light output "Ab" in the non-lighting period "Tb". Thus, since the received light output "Ab" of the non-lighting period "Tb" of the light source 1 corresponds to a height of the curve E, the received light output "Aa" of the lighting period "Ta" of the light source 1 becomes higher than the curve E. That is, when the lighting period and the non-lighting period are alternately repeated, the received light outputs "Aa", "Ab" of the image sensor 2 are higher than the curve E in the lighting period "Ta", and equal to the height of the curve E in the non-lighting period. The received light output corresponding to the light irradiated to the target space from the light source 1 is provided by the region higher than the curve E. Therefore, by determining the difference (Aa−Ab) between the received light output "Aa" obtained at the lighting period "Ta" and the received light output "Ab" obtained at the non-lighting period "Tb", it is possible to extract only the component of light irradiated to the target space from the light source 1 without the influence of environmental light. This difference (Aa−Ab) is associated with the position of each of the light receiving elements 1, thereby obtaining the amplitude image.

The difference (Aa−Ab) is determined from the received light output "Aa" of the lighting period "Ta" and the received light output of the non-lighting period "Ta" adjacent to the lighting period "Ta" (the non-lighting period "Tb" is provided immediately after the lighting period "Ta" in FIG. 5.). In this case, it is assumed that there is no substantial change in intensity of the environmental light E within a total of the lighting period "Ta" and the non-lighting period "Tb" needed to determine the difference (Aa−Ab). Therefore, the received light output based on the environmental light in the lighting period "Ta" and the received light output based on the environmental light in the non-lighting period "Tb" are cancelled each other, thereby obtaining only the received light output corresponding to a reflection light reflected from the object M by irradiating the light from the light source 1 to the target space. As a result, it is possible to obtain the amplitude image that is an emphasized image of the object M.

On the other hand, the gray image generator 42 generates an image, in which the received light output "Aa" of the lighting period "Ta", the received light output "Ab" of the non-lighting period "Tb", or an average of these received light outputs (Aa, Ab) is associated with the position of each of the light receiving elements 20. In this case, since light other than the reflection light from the object M is used to generate the image, it is possible to obtain a general gray image including the background as well as the object M. The gray image of the present embodiment is generated by use of the received light output "Aa" obtained in the lighting period "Ta" of the light source 1.

By the way, it is not needed to maintain the photoelectric converter 22 in the high sensitivity state over the entire period of the light period "Ta" or the non-lighting period "Tb", as shown in FIG. 3A. According to the technical concept of the present invention, the photoelectric converter 22 may be set to the high sensitivity state in a part of the lighting period "Ta" or the non-lighting period "Tb". In this case, under the condition that the electric charges are collected in a constant time period, the duty ratio of the lighting period "Ta" and the non-lighting period "Tb" may be other than 50%. In addition, when a distance to the object M is already known, the lighting period "Ta" and the non-lighting period "Tb" can be determined in consideration of a delay time "Td" depending on the distance to the object M, as shown in FIGS. 6A and 6B. That is, the lighting period "Ta" and the non-lighting period "Tb" can be respectively set after the elapse of the delay time from when the light source 1 is turned on and off, in order to collect the electric charges in the photoelectric converter 22 of the high sensitivity state. In this case, as compared with the control manner shown in FIGS. 3A and 3B, the amounts of electric charges collected in the charge storage portion 26 are reduced depending on the delay time "Td". However, it is possible to obtain the received light outputs (Aa, Ab) accurately corresponding to the light amounts received in the lighting period "Ta" and the non-lighting period "Tb", and therefore exclude the influence of environmental light with reliability.

In addition, when each of the lighting period "Ta" and the non-lighting period "Tb" is set to a relatively short time period, and only one cycle of the lighting period "Ta" and the non-lighting period "Tb" is performed, it is difficult to obtain sufficient received light outputs needed in the evaluation unit 4. In such a case, it is preferred that the electric charges collected over plural times of the lighting period "Ta" by the charge storage portion 26, and similarly the electric charges collected over plural times of the non-lighting period "Tb" by the charge storage portion 26 are respectively used as the received light outputs. As described above, the collection period for collecting the electric charges in the charge storage portion 26, and the ejection period for outputting the collected electric charges from the charge storage portion 26 to the evaluation unit 4 by the charge ejecting portion 28 can be adjusted according to the control voltage applied to the electrodes 24. In the present embodiment, the two kinds of received light outputs are obtained by the two light receiving elements 20 used as one pixel from the three time periods of the collection period for collecting the electric charges in the lighting period "Ta", the collection period for collecting in the non-lighting period "Tb", and the ejection period for outputting the electric charges collected in the both periods. As a modification of the present embodiment, a single light receiving element may be used as one pixel. In this case, it is preferred to control the pattern of applying the control voltage to the electrodes 24 by the control circuit 3 such that an ejection period where the electric charges collected under the high sensitivity state by increasing the area of the charge storage portion 26 in the lighting period "Ta" of the light source 1 are provided as the received light output to the evaluation unit 4, and an ejection period where the electric charges collected under the high sensitivity state by increasing the area of the charge storage portion 26 in the non-lighting period "Tb" of the light source 1 are provided as the received light output to the evaluation unit 4 are repeated. Therefore, the two kinds of received light outputs are obtained by four different periods of the collection period for collecting the electric charges in the lighting period "Ta"), the ejection period for outputting the collected electric charges, the collection period for collecting the electric charges in the non-lighting period "Tb", and the ejection period for ejecting the collected electric charges.

Figure 7A:
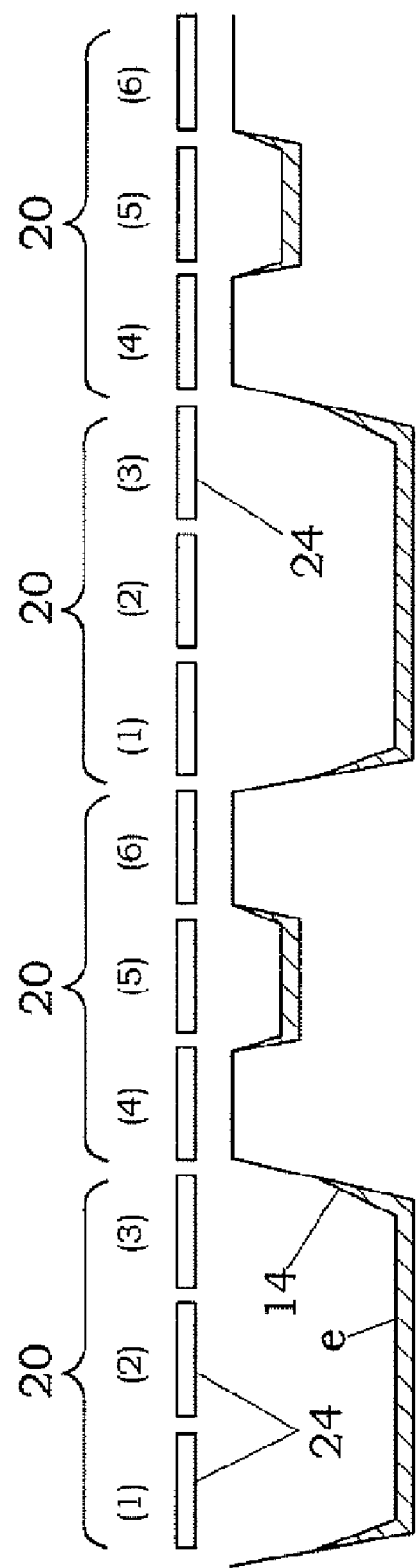
FIGS. 7A and 7B are schematic diagrams showing charge storage portions at a lighting period and a non-lighting period of the light source according to a second modification of the first embodiment.
Figure 7B:
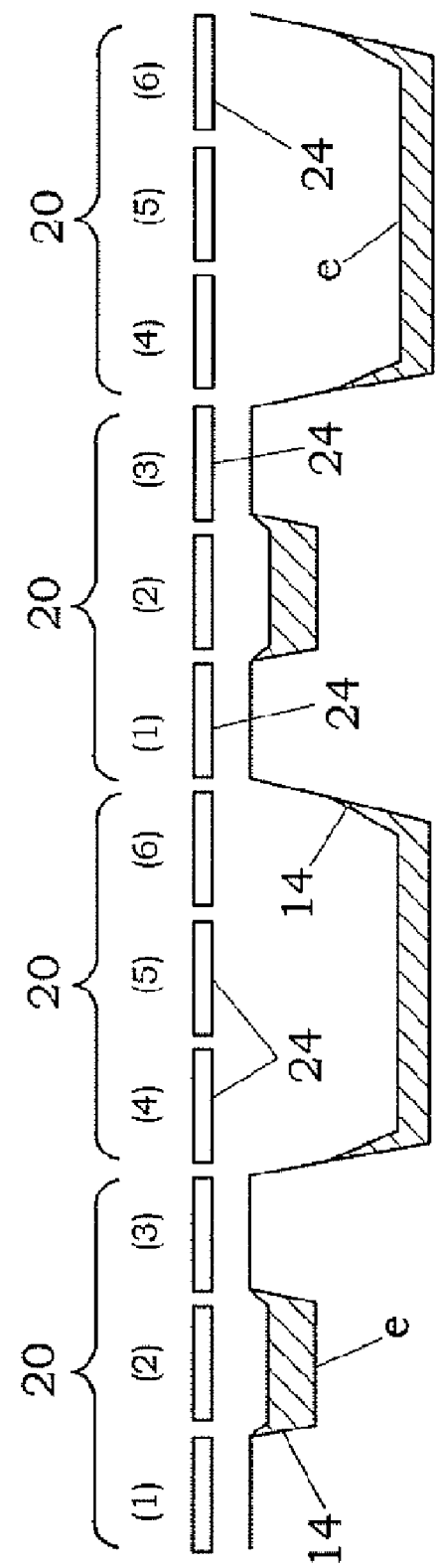

As a modification of the present embodiment, both of the area and the depth of the potential well 14 may be changed. For example, as shown in FIGS. 7A and 7B, it is preferred that the control voltage (+V1, e.g., 7V) simultaneously applied to the three electrodes (1) to (3) or (4) to (6) is set to be higher than the control voltage (+V2, e.g., 3V) applied to only the single electrode (2) or (5). In this case, the potential well 14 having the large area becomes greater in depth than the potential well 14 having the small area.

By the way, the electric charges generated at the region corresponding to the electrode (1), (3) or (4), (6), to which the control voltage is not applied, tends to flow into the potential well 14. In this case, it is believed that as the potential well 14 is deeper, the electric charges easily flow in the potential well. This means that larger amounts of electric charges flow into the potential well 14 of the high sensitivity state. As a result, it is possible to lower the probability that unwanted electric charges generated at the regions corresponding to the electrodes (1), (3) or (4), (6) flow into the potential well 14 of the low sensitivity state. In brief, it is possible to further reduce the amounts of unwanted electric charges flowing into the potential well 14 for holding the electric charges.

Figure 8A:
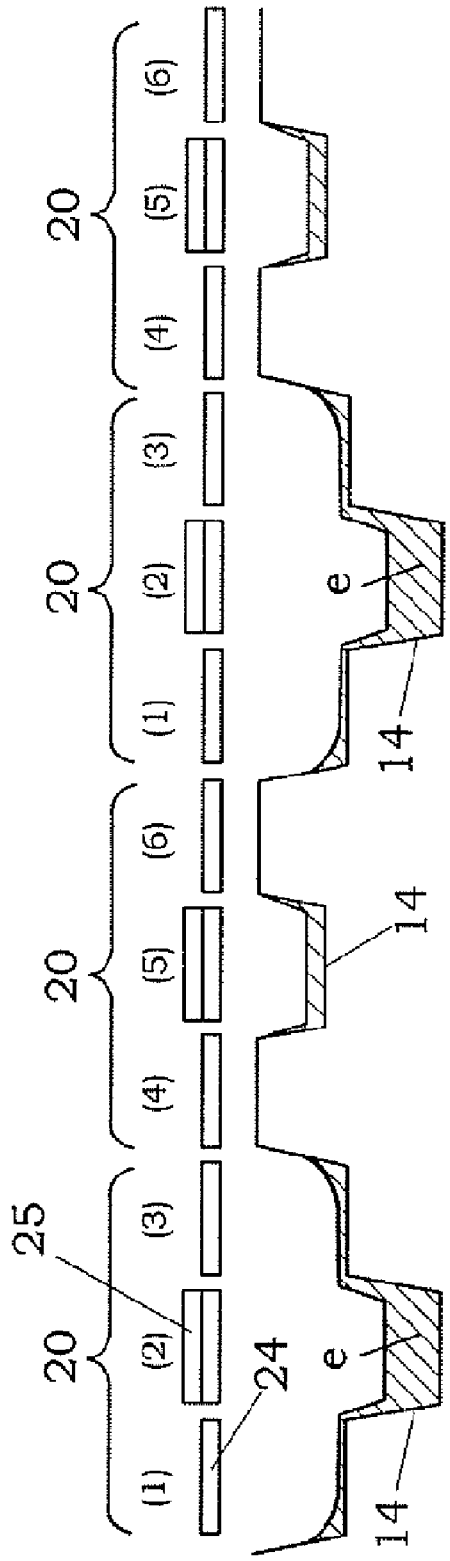
FIGS. 8A and 8B are schematic diagrams showing charge storage portions at a lighting period and a non-lighting period of the light source according to a third modification of the first embodiment.
Figure 8B:
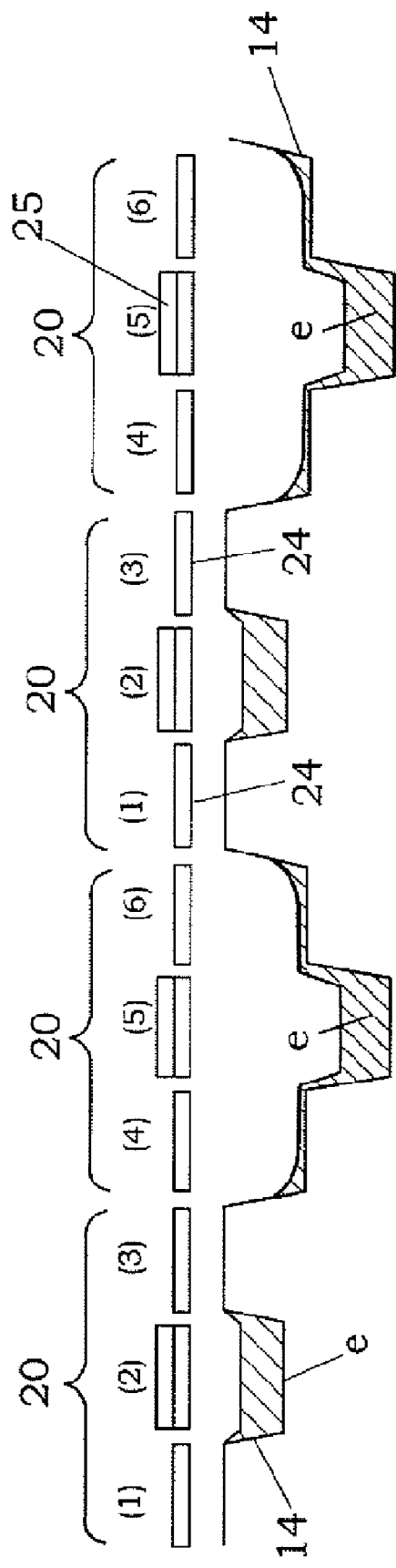

As a third modification of the present embodiment, as shown in FIGS. 8A and 8B, it is preferred that the control voltage applied to the center electrode (2) of the three electrodes (1) to (3) or the center electrode (5) of the three electrodes (4) to (6) of each of the light receiving elements 20 is higher than the control voltage applied the side electrodes (1), (3) or (4), (6), and a light shielding film 25 is disposed on the center electrode (2) or (5). In this case, the electric charges can be hardly generated at the region corresponding to the electrode (2) or (5) by the presence of the light shielding film 25, but the electric charges generated at the regions corresponding to the electrodes (1), (3) or (4), (6) of the light receiving elements 20 are allowed to flow in the region corresponding to the electrode (2) or (5). In addition, since the light receiving element 20 is partially covered by the light shielding film 15, the electric charges are hardly generated at a portion of the potential well 14 covered by the light shielding film 15. Therefore, the electric charges are hardly generated under the condition of reducing the area of the potential well 14 to hold the electric charges, thereby remarkably lowering the probability that unwanted electric charges are mixed as noise components.

Thus, in the case of forming the deep region and the shallow region in a stepwise manner in the potential well 14, as soon as the electric charges are generated at the regions corresponding to the electrodes (1), (3) or (4), (6), they move to the region corresponding to the electrode (2) or (5). Therefore, even when the period of generating the electric charges and the period of holding the electric charges are switched within a short time period of several nanoseconds (ns) or less, it is possible to reduce the possibility that the electric charges are mixed between the potential wells 14 formed in adjacent light receiving elements 20, and therefore achieve a reduction in noise components. As the technique of forming the potential well 14 in the stepwise manner, a method other than the formation of the light shielding film 15 may be used.

In the present embodiment and the above modifications, the number of electrodes formed on each of the light receiving elements 20 is not limited to three. In addition, the number of electrodes, to which the control voltage is applied in the high sensitivity state or the low sensitivity state, can be optionally determined. The image sensor 2 of this embodiment is composed of the two-dimensional array of the light receiving elements 20. Alternatively, an one-dimensional array of the light receiving elements may be used. As described in the first modification, it is not impossible to use only one light receiving element 20. It is also available that a concentration distribution of an impurity is formed in the semiconductor layer 11 of the light receiving element 20 according to distance from the electrode 24 along the light receiving surface, and the area of the charge storage portion 26 is changed by controlling the voltage applied to the electrode 24.

Second Embodiment

A spatial information detecting device of the present embodiment is characterized by extracting a characteristic amount of a target such as a face from an amplitude image, comparing with a previously prepared template to identify the target with high accuracy, and is substantially the same as the first embodiment except for the following components. Therefore, duplication explanations of the same components are omitted.

Figure 9:
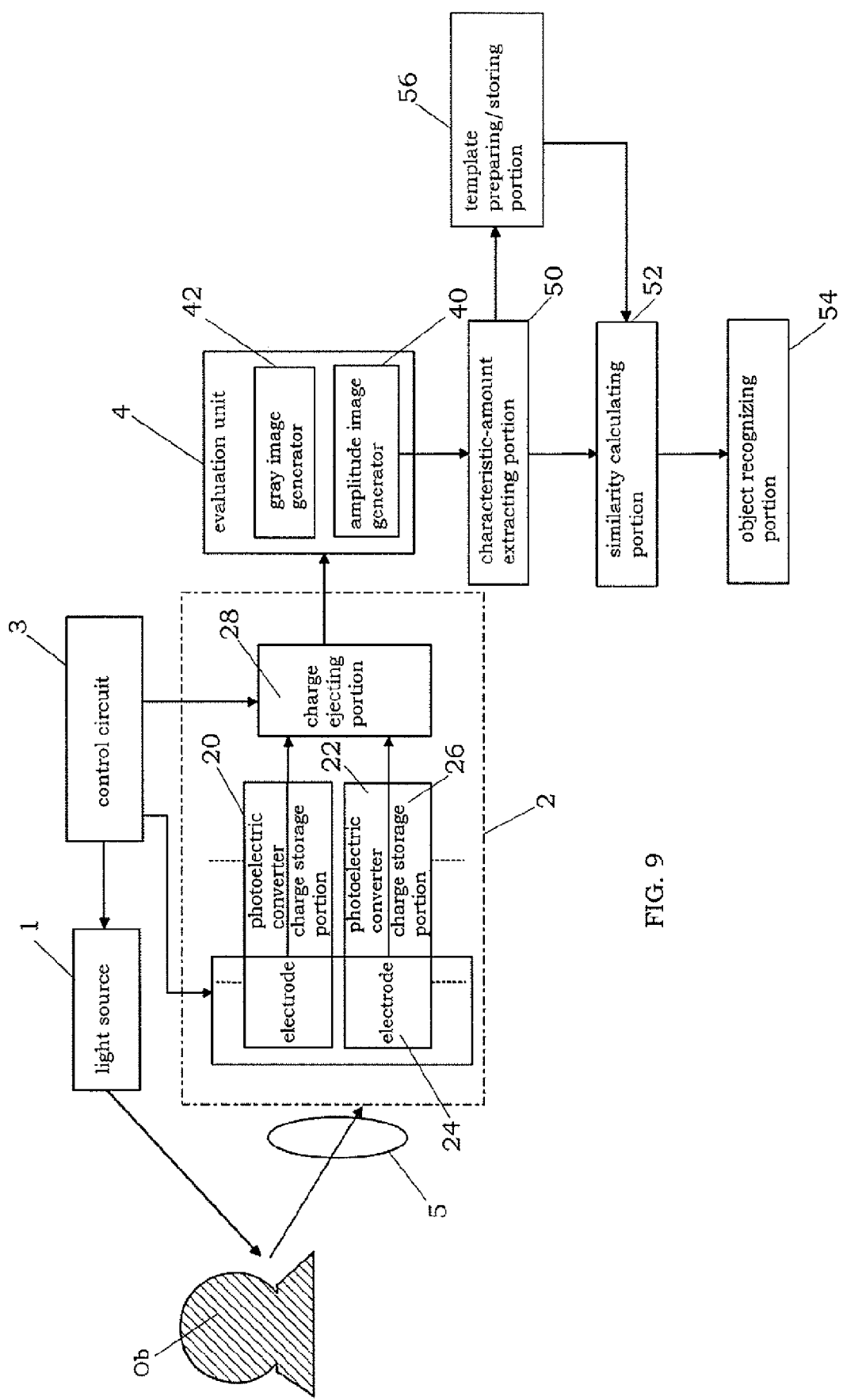
FIG. 9 is a block diagram of a spatial information detecting device according to a second embodiment of the present invention.

In the spatial information detecting device of this embodiment, as shown in FIG. 9, a characteristic-amount extracting portion 50 extracts the characteristic amount of the object (person Ob) in the target space according to the amplitude image generated by the amplitude image generator 40. On the other hand, a face template is stored in a template preparing/storing portion 56. This face template is prepared by previously taking a face image of the object (person Ob) to be recognized, and then extracting the characteristic amount from the face image by the characteristic-amount extracting portion. The characteristic amount of the object extracted from the amplitude image generated in an actual measurement by the characteristic-amount extracting portion 50 is compared with the face template stored in the template preparing/storing portion 56 to calculate a degree of similarity therebetween by a similarity calculating portion 52. In an object recognizing portion 54, when the degree of similarity calculated by the similarity calculating portion 52 is not smaller than a predetermined value, the detected object is recognized as the person corresponding to the face template. An operation mode for preparing the template and an operation mode for performing the actual measurement can be switched by an operation-mode selector (not shown).

Figure 10C:
FIG. 10C is an amplitude differential image of FIG. 10A.

The characteristic-amount extracting portion 50 of this embodiment comprises an amplitude differential image generator (not shown) for generating an amplitude differential image having an amplitude differential value as a pixel value, which is a differential intensity value of each pixel determined from an amplitude value of the amplitude image, and an image processing portion (not shown) for generating an output image, which is obtained by binarizing the amplitude differential image with a predetermined threshold value. The characteristic amount of the object (i.e., face) is extracted from the output image generated by the image processing portion. FIG. 10A is an example of the gray image. FIG. 10B is an amplitude image corresponding to the gray image. FIG. 10C is an amplitude differential image prepared from the amplitude image.

In a coordinate system for the amplitude image shown in FIG. 10B, an upper left position of the amplitude image is the origin, the positive direction (x direction) on the x axis corresponds to a horizontal right direction, and the positive direction (y direction) on the y-axis corresponds to a vertical downward direction In the characteristic-amount extracting portion 50, a local spatial differentiation is performed by use of a Sobel filter (hx) for the x direction and a Sobel filter (hy) for the y direction, each of which has a mask size of 3×3 pixels, as shown in FIG. 10B, with respect to all of the pixels of the amplitude image, thereby generating the amplitude differential image having the amplitude differential value as the pixel, which is the differential intensity value of each pixel determined form the amplitude value of the amplitude image. The characteristic amounts of the face of the person Ob can be extracted from the output image obtained by binarizing the amplitude differential image with the threshold value. An arrangement of weighting factors on the amplitude image is shown in each of the Sobel filters of FIG. 10B.

When the differential intensity value at a pixel (u, v) of the amplitude image is represented by $|G(u,v)|$, it is a value determined by using pixel values (in the present embodiment, amplitude values) of 8 pixels positioned around a center pixel in the amplitude image. When the pixel values of the pixels (p1) to (p9) in a local region (rectangular region) provided by a 3×3 pixel arrangement having the center pixel (p5), as shown in FIG. 11A are respectively represented by (a) to (i), as shown in FIG. 10B, the differential intensity value $|G(u,v)|$ is expressed by the following equation (1) using a differential value (dx) in the x direction and a differential value (dy) in the y direction.

$$|G(u,v)| = \{(dx^2(u,v) + dy^2(u,v))\}^{1/2} \quad (1)$$

wherein, $$dx(u,v) = (c+2f+i)-(a+2d+g) \quad (2)$$

$$dy(u,v) = (g+2h+i)-(a+2b+c) \quad (3)$$

In the amplitude differential image having the amplitude differential value determined by the equation (1) as the pixel value, as an amplitude difference in the amplitude image increases, the amplitude differential value becomes larger. After the characteristic-amount generating portion 50 generates the output image by binarizing the amplitude differential image with the threshold value, the similarity calculating portion 52 compares the characteristic amount of the object Ob extracted by the characteristic-amount generating portion 50 with the template stored in the template preparing/storing portion 56, thereby calculating the degree of similarity therebetween. When the degree of similarity provided from the similarity calculating portion 52 is not smaller than the threshold value, the object recognizing portion 54 recognizes the detected object Ob as the person's face corresponding to the face template. In the object recognizing portion 54, a conventional face recognizing technique can be used. For example, a conventional transformation technique such as affine transformation can be appropriately used.

In the present embodiment, since the output image obtained by binarizing the amplitude differential image is used, it is possible to reduce the data amount (information amount) as compared with the case of using the amplitude image, and therefore efficiently perform the face recognition treatment. In addition, there is a further advantage of accurately recognizing the object because a region having a large distance change ratio such as a step can be readily identified from the region having a small distance change ratio.

As compared with a case of preparing a gray differential image having pixel values, each of which is a differential intensity value of each pixel of the gray image, under the presence of an illumination light, and using an image obtained by binarizing the prepared gray differential image with a predetermined threshold value, it is possible to accurately recognize the object with reliability by the object recognizing portion 54, while minimizing the influence of environmental light, in the case of preparing the amplitude differential image having pixel values, each of which is a differential intensity value of each pixel of the amplitude image, under the presence of the same illumination light, and using the image obtained by binarizing the prepared amplitude differential image with a predetermined threshold value.

As a first modification of this embodiment, the recognition may be performed in accordance with a positional relationship of the characteristic amount in place of performing the recognition with the whole face. For example, an output image shown in FIG. 12B (i.e., an image obtained by binarizing the amplitude differential image) is prepared from an amplitude image shown in FIG. 12A. In the case of binarizing the amplitude differential image, regions corresponding to eye, nose and mouse have larger differential intensity values than the regions corresponding to cheek and forehead. Therefore, as shown in FIG. 12C, end points of the regions corresponding to eye, nose and mouse can be extracted as the characteristic point C of the face. Since a candidate of the face template having higher reliability of matching is determined according to the positional relationship of these characteristic points, and then the degree of similarity is preferentially calculated by use of the candidate, it is possible to save time needed for the recognition.

Figure 10D:
FIG. 10D is an amplitude-gradient directional image of FIG. 10A.

As a second modification of this embodiment, the characteristic amount may be extracted from an amplitude-gradient directional image shown in FIG. 10D in place of the amplitude differential image. That is, the characteristic-amount extracting portion 50 comprises an amplitude-gradient directional image generator (not shown) for generating the amplitude-gradient directional image having an amplitude-gradient directional value as a pixel value, which is a differential directional value of each pixel determined from the amplitude value of the amplitude image. The characteristic amount is extracted from the amplitude-gradient directional image. In this case, there is an advantage of reducing the influence of a change in distance between the object in the target space and the light source on a change in reflection light from the object Ob, and therefore accurately recognizing the object even when a fluctuation of illumination occurs.

To generate the amplitude-gradient directional image, as described in the above embodiment, a local spatial differentiation is performed by use of the Sobel filters (hx, hy), each of which has a mask size of 3×3 pixels, with respect to all of the pixels of the amplitude image, in order to generate the amplitude-gradient directional image having the amplitude gradient directional value as the pixel value, which is the differential directional value of each pixel determined from the amplitude value of the amplitude image. The amplitude-gradient directional value θ is expressed by the following equation (4) using the above-described equations (2) and (3).

$$\theta = \tan^{-1}\{dx/dy\} \quad (4)$$

The amplitude gradient directional image of FIG. 10D is an image having a concentration value as the pixel value, which is converted from the amplitude-gradient directional value θ by use of a scale that as the amplitude gradient directional value θ determined by the equation (4) increases within a range of 0 to 359 degrees, the concentration value gradually increases (when the amplitude gradient directional value θ is 0 degree, the concentration value becomes minimum, and when the amplitude gradient directional value θ is 359 degrees, the concentration value becomes maximum). In the case of using of the amplitude-gradient directional value, the object recognition is performed by the similarity calculating portion 52 and the object recognizing portion 54, as in the case of using the amplitude differential image.

Figure 13A:
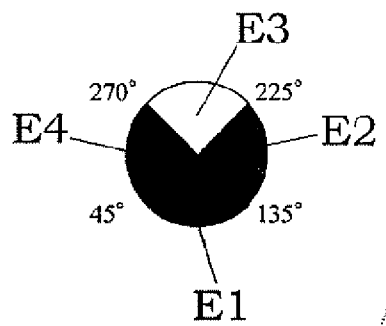
FIGS. 13A to 13C are explanatory views showing a method of extracting characteristic amounts from the amplitude-gradient directional image.
Figure 13B:
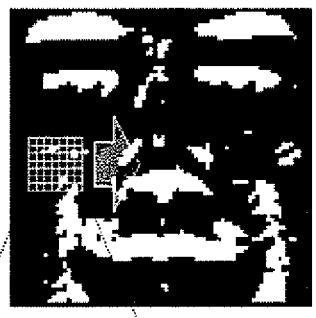
Figure 13C:

To extract the characteristic amount in the characteristic-amount extracting portion 50, for example, a four-value processing of the amplitude gradient directional value is performed with respect to four directions E1, E2, E3, and E4, as shown in FIG. 13A, in order to prepare the amplitude gradient directional image (in this case, four-valued image), as shown in FIG. 11B. Next, by using a filter (h1) having a mask size of 7×7 pixels shown in FIG. 11B with respect to all of the pixels, the numbers of the four directions (E1, E2, E3, E4) included in the filter (h1) are respectively counted. When each of the number counted of the direction E1 and the number counted of the direction E3 is not smaller than a threshold value (e.g., 14), the position (i.e., the center pixel of the 7×7 pixels) is regarded as an effective pixel. When it is smaller than the threshold value, the position is regarded as an invalid pixel. As a result, a mask image where the effective pixel is shown by a white region, and the invalid pixel is shown by a black region is obtained, as shown in FIG. 13C. By performing a mask treatment with this mask image, only characteristic parts such as eye, nose and mouse peculiar to individual objects can be extracted. Therefore, the face recognition can be performed by use of only the extracted parts. In this case, it is possible to save time needed for the recognition, as compared with the case of performing the recognition treatment by use of the image of the whole face.

In the above characteristic-amount extracting portion 50, dx(u,v) and dy(u,v) are calculated by use of the pixel values (a) to (d), (f) to (i) of the 8 pixels (p1) to (p4), (p6) to (p9) positioned around the center pixel (p5) (see FIG. 11A) to determine the amplitude gradient directional value θ. Alternatively, it may be calculated by use of the pixel values of 4 pixels or 16 pixels positioned around. In addition, arctan ($\tan^{-1}$) is used in this embodiment as a function of determining the amplitude gradient directional value θ from dx(u,v) and dy(u,v). Other functions are also available. For example, it is desired to use a function, by use of which the nonlinearity of the ratio of dx(u,v) and dy(u,v) can be corrected to obtain the linearity of the amplitude gradient directional value θ.

Third Embodiment

A spatial information detecting device of the present embodiment is characterized by performing a regulation treatment for preventing saturation of the received light output to stably generate a significant amplitude image, and is the substantially same as the first embodiment except for the following components. Therefore, duplication explanations of the same components are omitted.

Figure 14:
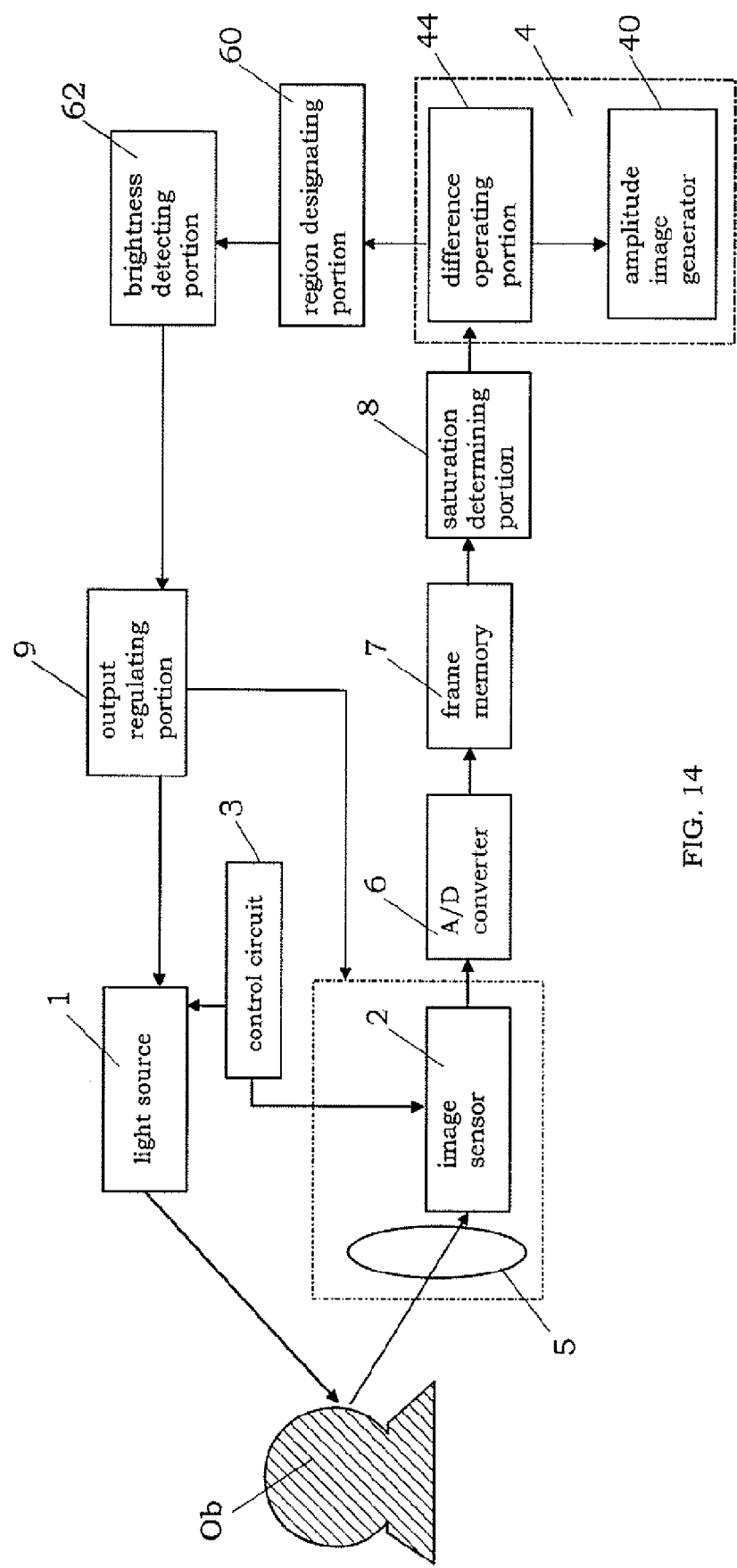
FIG. 14 is a block diagram of a spatial information detecting device according to a third embodiment of the present invention.

In the spatial information detecting device of the present embodiment, as shown in FIG. 14, the light source 1 provides a flashing light having a flash period of 10 to 100 kHz. The image sensor 2 has the capability of adjusting a light receiving sensitivity with respect to each of the pixels. By receiving the light from the target space in each of the lighting period and the non-lighting period of the flashing light source 1, the image sensor 1 outputs electric charges collected in a predetermined number of cycles of a modulation signal as the received light output. For example, when a frequency of the modulation signal is 30 Hz, the image sensor 2 can output 60 received light outputs per 1 second (i.e., 30 lighting periods and 30 non-lighting periods) In the following explanation, a unit of the received-light output provided at a time from the image sensor 2 is defined as one frame. Therefore, when the received light output is output in each of the lighting period and the non-lighting period, two frames of data are obtained.

The output of the image sensor 2 is converted into a digital signal by an A/D converter 6, and then temporarily stored in a frame memory 7. The frame memory 7 may have a capacity of at least 2 frames such that a set of the received light outputs obtained in the lighting period and the non-lighting period can be stored. On the assumption that there is no fluctuation in light amount of environmental light (sun light or illumination light) received by the image sensor 2 within one cycle of the modulation signal, a difference between the received light outputs obtained in the lighting period and the non-lighting period is associated with an amplitude of a reflection light reflected from an object (Ob) in the target space, into which a signal light is being irradiated from the light source 1. When the received light output is output from the image sensor 2, it is stored in the frame memory 7, and when the electric charges are collected by the image sensor 2, the stored data is read out from the frame memory 7.

The evaluation unit 4 comprises a difference operating portion 44 for calculating the difference between the received light outputs corresponding to the two frames of data stored in the frame memory 7. The difference value is input in an amplitude image generator 40 to obtain a difference image (i.e., amplitude image) having, as a pixel value, the difference between the lighting period and the non-lighting period with respect to each of the pixels. Each of the pixel values of this difference image ideally corresponds to a received light intensity of the signal light. Therefore, it is possible to obtain a difference image associated with the amplitude of the signal light received by the image sensor 2. For example, when the received light output corresponding to an image P1 of FIG. 15A is obtained in the lighting period, and the received light output corresponding to the image P2 of FIG. 15B is obtained in the non-lighting period, an amplitude image P3 shown in FIG. 15C is obtained. In the amplitude image, the background other than the object (Ob) reflecting the signal light in the target space is deleted, so that only the object (Ob) exits in the amplitude image (the pixel values of other than the object (Ob) are zero, i.e., black pixels). In addition, by passing only one of the received light outputs obtained in the lighting period and the non-lighting period without determining the difference therebetween, it is possible to obtain a gray image including the background.

In FIG. 14, the numeral 8 designates a saturation determining portion provided between the frame memory 7 and the evaluation unit 4. In the saturation determining portion 8, the received light outputs obtained in the lighting period and the non-lighting period are compared with a saturation threshold value predetermined with respect to each of the pixels. For example, when the received light output of each of the pixels obtained in the lighting period is (Aa), and the received light output of each of the pixels obtained in the non-lighting period is (Ab), a relationship of (Aa>Ab) is generally realized in a short time period where a change in environmental light does not substantially occur. Therefore, when the received light output (Aa) does not exceed the predetermined saturation threshold value (Th1), the received light output (Ab) also does not exceed the saturation threshold value (Th1). In the saturation determining portion 8, the received light output (Aa) obtained in the lighting period is compared with the saturation threshold value (Th1), as shown by the step (S32) in FIG. 16. The saturation threshold value (Th1) is a threshold value for checking the saturation of the received light output "Aa". When the received light output (Aa) exceeds the saturation threshold value (Th1), the saturation determining portion 8 determines that the received light output (Aa) has been saturated. If necessary, the comparison between the saturation threshold value (Th1) and the received light output (Ab) may be also performed.

The saturated received light output (Aa) does not provide the spatial information. In other words, even if the difference ΔA is determined by the evaluation unit 4, the amplitude image can not be generated. Therefore, when the saturation is detected by the saturation determining portion 8, an order of changing the output value to a predetermined value is sent to the difference operating portion 44. That is, when the saturation is confirmed, the output of the difference operating portion 44 is changed to the predetermined value. As the predetermined value, it is possible to use a maximum value or a central value of a permissible range of the output value of the difference operating portion 44, or a specific value, which is not usually output from the difference operating portion 44. For example, when the received light output (Aa, Ab) is represented by 8 bits, i.e., 255 levels, the maximum value of 255 can be used as the predetermined value. In the case of using the maximum value as the output value of the difference determining portion 44, it is possible to distinguish the pixel providing the saturated received light output (Aa) from the background. On the other hand, when using the central value of the permissible range of the output value of the difference operating portion 44, it is possible to obtain the amplitude image without feeling of strangeness because a differences between the saturated pixel value and the surrounding pixel values become relatively small.

In addition, when the predetermined value is provided by a value, which does not occur at another pixels (for example, when 254 levels of the 255 levels are used to represent the difference ΔA, the value of 255 does not occurs as the difference ΔA), the pixel of the predetermined value can be regarded as an invalid pixel showing that the received light output (Aa) has been saturated. Thus, since the saturated pixel is distinguished as the invalid pixel from the other pixels, the invalid pixel can be interpolated with values of the surrounding pixels by the amplitude image generator 40. When using the interpolated amplitude image, the pixel having an abnormal value hardly appears, so that an image with a reduced feeling of strangeness can be obtained.

By the way, the predetermined value is merely a pseudo value for avoiding the feeling of strangeness when the amplitude image is displayed, and the saturated received light output does not reflect the spatial information. Therefore, it is needed to perform a regulation such that the received light output stored in the frame memory 7 at the next time does not exceed the saturation threshold value. In addition, as described above, the purpose of using the amplitude image is to obtain an image of on W the object (Ob) without the background. Therefore, when the received light output of the pixel corresponding to the object (Ob) is not saturated, it is possible to obtain an intended amplitude image.

When the occurrence of saturation in a designated region is checked as to the received light output of the image sensor 2, and it is confirmed that the received light output has been saturated in the designated region, it is preferred to lower the received light output by, for example, reducing an emission intensity of the light source 1, reducing a transmission factor of the light receiving optical system, or shortening the period of collecting the electric charges by the image sensor 2. In this case, the saturation of the received light output can be effectively prevented.

In the present embodiment, since the output of the difference operating portion 44 is set to the predetermined value when the received light output is saturated, it is possible to prevent the occurrence of feeling of strangeness in the amplitude image, and also use the predetermined value for the regulation. As the designated region, a region corresponding to the object (Ob) is used. The designated region can be determined by a region designating portion 60 by use of the output of the difference operating portion 44. That is, the region designating portion 60 determines, as the designated region, a region where the difference $\Delta A$ output from the difference operating portion 44 exceeds an effective threshold value (Th2), as shown by the steps of (S7) to (S9) in FIG. 16. In this method, the designated region (Da) shown in FIG. 15D can be determined from the amplitude image (P3) shown in FIG. 15C. In addition, when the present device is used as a camera for a door phone system, the effective threshold value (Th2) are previously determined such that a person's face existing within a required distance range from the image sensor 2 is extracted as the object (Ob).

However, there is a case that the difference value does not exceed the effective threshold value (Th2) even within the above range previously set for the object (Ob) due to a difference in reflectance or a distance difference caused by irregularity (a location where the received light output has been saturated is replaced by the predetermined value so as to exceed the effective threshold value (Th2)). In this case, an expanding treatment is performed to the region exceeding the effective threshold value (Th2). By this treatment, even when a region exceeds the effective threshold value (Th2) as a whole, but a small part of the region does not exceed the effective threshold value (Th2), the small part can be included in the designated region. For example, when the object (Ob) is a face, reflectance is low at eye, eyebrows and hairs. In these small regions, there is a possibility that the difference obtained at the difference operating portion 44 becomes smaller than the effective threshold value (Th2). However, there are remarkable amounts of the pixels exceeding the effective threshold value (Th2) as the whole face, it is possible to consider the eye, eyebrows and the as the designated region by the expanding treatment.

In addition, an average value of the received light outputs of the pixels in the designated region detected by the region designating portion 60 is determined by a brightness detecting portion 62. By using this average value, a regulation amount for a regulation objective is determined by an output regulating portion 9. That is, a reference value corresponding to adequate brightness of the object (Ob) in the amplitude image is previously set in the brightness detecting portion 62, and an error between the above average value and the reference value as a target value is determined. In addition, the output regulating portion 9 determines the regulation amount against the regulation objective according to the error provided from the brightness detecting portion 62.

In the output regulating portion 9, when the average value of the received light outputs in the designated region is larger than the reference value, the regulation amount is determined in a direction of reducing the received light output. On the contrary, when the average value of the received light outputs is smaller than the reference value, the regulation amount is determined in a direction of increasing the received light output. The regulation objective has a permissible regulation range. Therefore, when the regulation amount reaches an upper or a lower limit of the permissible regulation range, the current status is maintained.

In the case of regulating a plurality of regulation objectives, an order of priority of the regulation objectives is previously determined, and when one of the regulation objectives reaches the upper or lower limit of the permissible regulation range, the other regulation objective may be regulated. In addition, it is preferred that a change ratio of the regulation amount is variable depending on a magnitude of the error. Moreover, it is preferred that the regulation amount can be changed at a time by a fixed change ratio, and when the error is large, the regulation amount is changed several times so as to approach the reference value. In this case, it is possible to prevent fluctuations of the amplitude image caused in response to an instantaneous change in light amount. In addition, is it preferred that the reference value has a range, and the regulation amount is not changed when the average value of the received light outputs in the designated region is within the range of the reference value. In this case, it is possible to prevent an unwanted operation on the regulation objective. As an initial value of the regulation objective at the time of starting the operation, it is desired to use an upper limit of the permissible regulation range.

As described above, the region designating portion 60, the brightness detecting portion 62 and the output regulating portion 9 determine the regulation amount for the regulation objective according to the results of the difference operating portion 44. In FIG. 14, the portions other than the light source 1 and the image sensor 2 can be realized by performing appropriate programs in a microcomputer.

Figure 16:
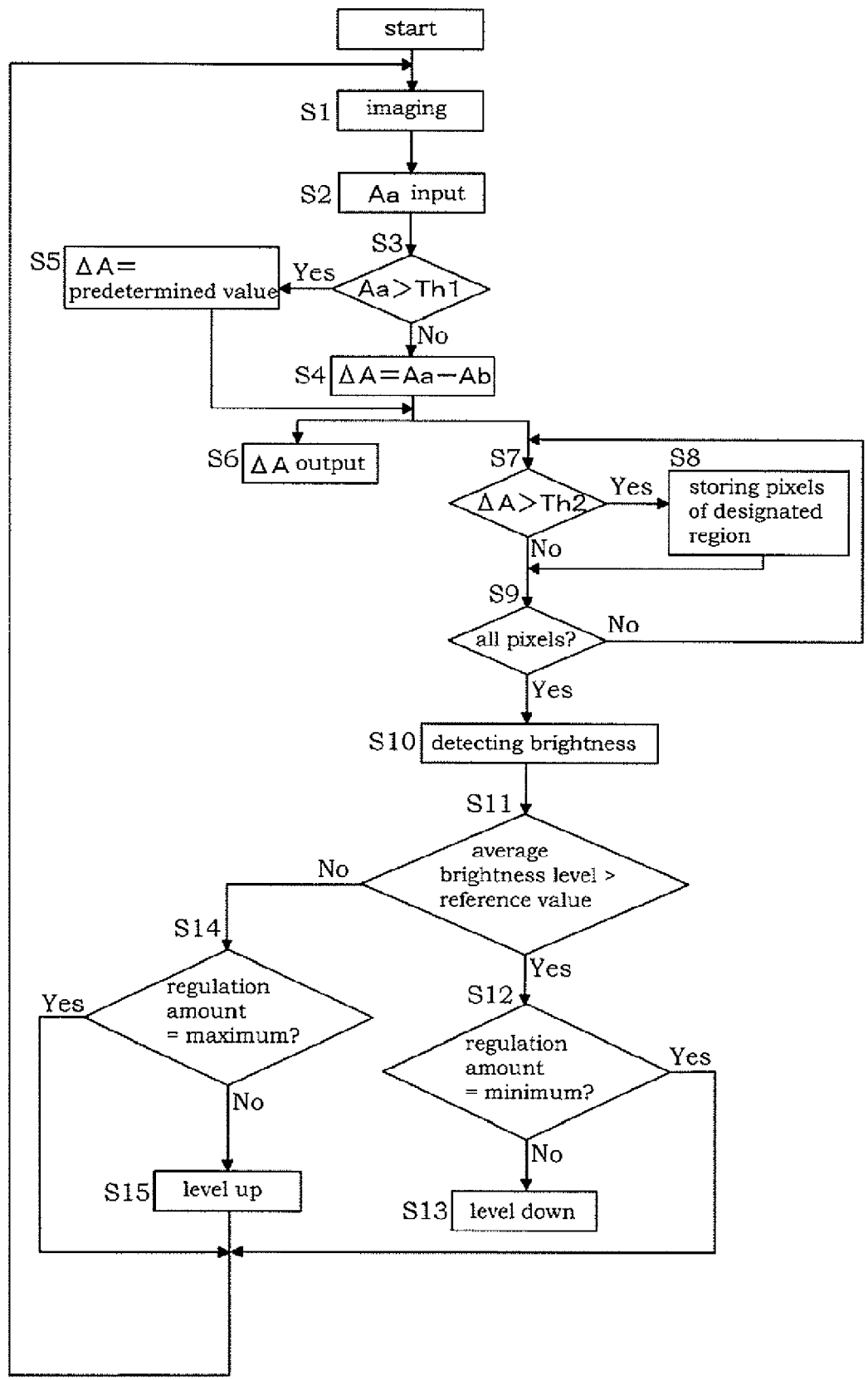
FIG. 16 is a flowchart showing an operation of the spatial information detecting device of the third embodiment.

An operation of the present embodiment is briefly explained with reference to a flowchart of FIG. 16. When the operation of the device is started, an image of the target space is firstly taken by the image sensor 2 (S1). As described above, the imaging is performed in synchronization with the lighting period and the non-lighting period of the light source 1. When the received light output (Aa) is obtained in the lighting period (S2), it is compared with the saturation threshold value (Th1) by the saturation determining portion 8 (S3). When the received light output (Aa) is not larger than the saturation threshold value (Th1), it means that the received light output has not been saturated. Therefore, the difference $\Delta A$ between the received light outputs (Aa, Ab) is determined by the difference operating portion 44 (S4). On the other hand, when the receive light output (Aa) exceeds the saturation threshold value (Th1), the difference $\Delta A$ is set to a predetermined value (S5). The thus obtained difference $\Delta A$ is output as the amplitude image through the amplitude image generator 40 (S6). The difference operating portion 44 also sends the obtained difference $\Delta A$ to the region designating portion 60. In the region designating portion 60, the difference $\Delta A$ is compared with the effective threshold value (Th2) (S7). The pixels exceeding the effective threshold value (Th2) are stored as pixels of the designated region (S8). This treatment is performed with respect to all of the pixels of the amplitude image (S9). When the designated region where the difference $\Delta A$ exceeds the effective threshold value (Th2) is obtained, an average value of the differences $\Delta A$ is determined with respect to the pixels in the designated region by the brightness detecting portion 62 (S10).

In the output regulating portion 9, the average value of the differences $\Delta A$ in the designated region is compared with the reference value (S11). When the average value is larger than the reference value, a regulation is performed to the regulation objective so as to decrease the received light output (S13). On the contrary, when the average value of the differences ΔA is not larger than the reference value, the regulation is performed to the regulation objective so as to increase the received light outputs (S15). Due to the presence of upper and lower limits of the regulation amount available to the regulation objective, when the regulation amount becomes minimum in the direction of reducing the received light output (S12), or maximum in the direction of increasing the received light output (S14), the next imaging step (S1) is performed without changing the regulation amount.

In the above operation, the output regulating portion 9 gives an order to the regulation objective every time that the difference of the received light outputs between the lighting period and the non-lighting period is obtained. Alternatively, the order may be given to the regulation objective when a state where the average value of the received light outputs determined by the brightness detecting portion 62 is greater than the reference value is successively repeated at a predetermined number of times, or a state where the average value of the received light outputs determined by the brightness detecting portion 62 is smaller than the reference value is successively repeated at a predetermined number of times.

To prevent the occurrence of hunting phenomena at the regulation objective, the output regulating portion 9 may have a hysteresis characteristic. For example, when the average value becomes larger than the reference value, so that the order of reducing the received light output is given to the regulation objective, a next order of increasing the received light output is not given even when an error occurs such that the average value becomes smaller than the reference value. Only when the absolute value of the error is not smaller than the predetermined value, the next order is provided. On the contrary, when the average value becomes smaller than the reference value, so that an order of increasing the received light output is given to the regulation objective, a next order of reducing the received light output is not given even when an error occurs such that the average value becomes greater than the reference value. Only when the absolute value of the error is not smaller than the predetermined value, the next order is provided. In place of determining the average value of the received light outputs by the brightness detecting portion 62, it is also preferred to count the number of pixels where the received light output exceeds the reference value in the designated region, and determine the regulation amount according to the counted number of the pixels.

In the above explanation, the average value of the received light outputs in the designated region is compared with a single reference value. Alternately, a plurality of reference values may be set such that the regulation amount for the regulation objective can be changed in a stepwise manner. In addition, when the reference value is set in each of a plurality stages, it is possible to count the number of pixels with respect to each of the stages, and determine the regulation amount so as to correspond to the stage where the counted number of the pixels is maximum.

In the case of exacting the designated region by the region designating portion 60, it is also preferred that a result obtained by multiplying the difference obtained by the difference operating portion 44 by a coefficient is compared with the effective threshold value (Th2), and the coefficient used for the multiplication is changed in a stepwise manner depending on the average value of the received light outputs determined by the brightness detecting portion 62. The coefficient is set such that as the average value is larger, the coefficient becomes smaller. When the image is dark due to a small average value of the received light outputs in the designated region, the region extracted as the designated region is increased by multiplying the difference by a larger coefficient. To determine the coefficient, the average value that is a representative value of the received light outputs determined by the brightness detecting portion 62 is used in this embodiment. Alternatively, it is possible to use another value such as maximum value and mode, as the representative value.

When the amplitude of the signal light is small, for example, the object (Ob) is spaced from the light source by a large distance, or reflectance of the object (Ob) is low, the object (Ob) can be included in the designated region with a higher possibility by increasing the designated region. By this operation, it is possible to substantially keep the pixel values corresponding to the object (Ob) within a predetermined range irrespective of a change in distance to the object (Ob) or reflectance of the object (Ob), and therefore obtain the amplitude image of the object (Ob) with better viewability from the amplitude image generator 40.

In the above structure, the region used to determine the average value (or the number of pixels satisfying a required condition) of the received light outputs by the brightness detecting portion 62 is not limited to the region, from which the object (Ob) is extracted. In the region designating portion 60, all of the pixels in the image may be set as the designated region. In addition, a predetermined region defined at a center portion of the image or a desired region in the image may be set as the designated region. Thus, how to set the designated region can be optionally determined for the purpose. In the case of previously determining the designated region, it can be determined by the region designating portion 60 independently from the difference obtained by the difference operating portion 44.

In the frame memory 7, the received light outputs corresponding to one cycle of the lighting period and the non-lighting period are stored, and the difference between the received light outputs corresponding to one cycle of the lighting period and the non-lighting period is determined at the difference operating portion 44. Alternatively, the received light output corresponding to plural times of the lighting periods and the received light output corresponding to plural times of the non-lighting periods may be stored in the frame memory 7 in an additional manner. In this case, since added values obtained by the plural cycles of the lighting period and the non-lighting period are used to perform the treatments in the difference operating portion 44, saturation determining portion 8, and the brightness detecting portion 62, it is possible to suppress the influence of noise components included in the received light output. In addition, it is possible to use an average value obtained by dividing the added values by the number of times of outputting the received light output. Furthermore, a sum of the differences obtained by the difference operating portion 44 or an average value of the differences may be used.

As described above, when the average value of the received light outputs or the average value of the differences of the received light outputs is used, and one of the number of times of adding and the divisor is changed, a similar advantage is expected, as in the case of changing the coefficient(s) used to determine the designated region by the region designating portion 60. In addition, when the average value of the received light outputs or the average value of the differences of the received light outputs is used, the frame rate lowers, but amounts of shot noises caused at the image sensor 2 can be reduced, as compared with the case of using the received light outputs corresponding to one cycle of the lighting period and the non-lighting period. Therefore, it is also preferred to reduce the number of times of adding under an indoor environment where the amount of environmental light is generally small, and on the other hand increase the number of time of adding under an outdoor environment where the amount of environmental light is generally large, in order to minimize the influence of noises.

The modulation signal used to control the flashing light source is not limited to a rectangular wave. For example, a sin wave, triangular wave, or a saw-tooth wave may be used, In this case, since the environmental-light component can be removed by extracting the received light outputs from the image sensor 2 in synchronization with two different phase periods of the modulation signal, and determining the difference between the received light outputs of these two phase periods, it is possible to obtain an image similar to the amplitude image. A duration of the period for extracting the received light output from the image sensor 2 can be optionally determined. When these phase periods are different from each other by a phase difference of 180 degrees, it is substantially equal to the case of determining the difference between the lighting period and the non-lighting period. The phase difference between the phase periods may be other than 180 degrees.

In addition, various components can be used for the light receiving optical system 5. In the case of using an iris diaphragm, it is preferred that an aperture diameter is adjustable according to an external signal. In addition, it is preferred that a plurality of neutral density filters having different transmission factors are prepared in addition to the ids diaphragm and lenses, and a suitable filter is selectively determined according to the external signal Alternatively, it is possible to use a neutral density filter using liquid crystal, which has the capability of changing the transmission factor according to the external signal.

INDUSTRIAL APPLICABILITY

As understood from the above explanations, the spatial information detecting device of the present invention has a refined device structure for effectively removing the influence of environmental light, and the capability of stably obtaining a significant amplitude image by performing an output regulation treatment for preventing saturation of the received light output. Therefore, the present invention is expected to be used in wide application fields, in which it is desired to detect the information of the target space with reliability.

The invention claimed is:

1. A spatial information detector, comprising:
   at least two photoelectric converters configured to receive a light from a target space, into which a light intensity-modulated at a modulation signal having a predetermined frequency is being irradiated, and generate an electric output corresponding to an intensity of the received light;
   at least one electrode formed on each of said at least two photoelectric converters;
   a charge storage formed in each of said at least two photoelectric converters by applying a control voltage to said at least one electrode to collect at least part of electric charges generated in said each of said at least two photoelectric converters;
   a controller configured to control the control voltage applied to said at least one electrode such that an area of said charge storage in one of two different phase periods of said modulation signal is different from the area of said charge storage in an other phase period of said modulation signal;
   a charge ejector configured to output the electric charges collected in said charge storage; and
   an evaluator configured to evaluate the target space according to a difference between the electric charges collected in the one of said two different phase periods by said charge storage formed in one of said at least two photoelectric converters, and the electric charges collected in the other phase period by said charge storage formed in the other one of said at least two photoelectric converters,
   wherein said at least two photoelectric converters receive light from the target space, into which a flashing light is being irradiated, and
   said evaluator evaluates the target space in accordance with a difference between electric charges collected in a lighting period of said flashing light by said charge storage formed in one of said at least two photoelectric converters, and electric charges collected in a non-lighting period of said flashing light by said charge storage formed in the other one of said photoelectric converters.

2. The spatial information detector as set forth in claim 1, wherein
   said controller controls the control voltage applied to said at least one electrode such that the area of said charge storage in the lighting period of said flashing light is different from the area of said charge storage in the non-lighting period of said flashing light.

3. The spatial information detector as set forth in claim 2, wherein said controller controls the control voltage applied to said at least one electrode such that the area of said charge storage formed in each of said at least two photoelectric converters changes in synchronization with a flash timing of said flashing light.

4. The spatial information detector as set forth in claim 3, wherein said controller controls the control voltage applied to said at least one electrode of each of said at least two photoelectric converters such that the area of said charge storage formed in one of said at least two photoelectric converters is larger in the lighting period than the non-lighting period, and the area of said charge storage formed in the other one of said at least two photoelectric converters is larger in the non-lighting period than the lighting period.

5. The spatial information detector as set forth in claim 4, wherein said controller controls the control voltage applied to said at least one electrode of each of said at least two photoelectric converters such that the area of said charge storage formed in one of said at least two photoelectric converters in the lighting period is equal to the area of said charge storage formed in the other one of said at least two photoelectric converters in the non-lighting period.

6. The spatial information detector as set forth in claim 1, wherein said at least one electrode comprises a plurality of electrodes, and said controller controls a number of said plurality of electrodes, to which the control voltage is applied, thereby changing the area of said charge storage.

7. The spatial information detector as set forth in claim 1, wherein said evaluator comprises an amplitude-image generator configured to generate an amplitude image having pixel values, each of which is provided by said difference.

8. The spatial information detector as set forth in claim 7, further comprising a characteristic-amount extractor configured to extract a characteristic amount of an object in said target space according to said amplitude image generated by said amplitude-image generator, a similarity calculator configured to calculate a degree of similarity by comparing said characteristic amount with a previously prepared template, and a target recognizer configured to recognize said object as a target object corresponding to said template when the degree of similarity is not smaller than a predetermined value.

9. The spatial information detector as set forth in claim 8, wherein said object to be detected is a face, and the spatial information detector further comprises a template storage configured to store a face template previously prepared according to characteristic amounts of said face, and said target recognizer recognizes said face as a person corresponding to said face template when the degree of similarity between said characteristic amount extracted by said characteristic-amount extractor and said face template stored in said template storage is not smaller than the predetermined value.

10. The spatial information detector as set forth in claim 7, further comprising a saturation determiner configured to compare a predetermined threshold value with amounts of electric charges collected in at least one of said two different phase periods of said modulation signal by said charge storage, and an output regulator configured to regulate an electric output corresponding to the intensity of received light according to a comparison result.

11. The spatial information detector as set forth in claim 10, wherein said output regulator reduces the electric output of a photoelectric converter when the amounts of electric charges are greater than the threshold value.

12. The spatial information detector as set forth in claim 7, further comprising a saturation determiner configured to compare a predetermined threshold value with amounts of electric charges collected in at least one of said two different phase periods of said modulation signal by said charge storage, and wherein said evaluator evaluates the target space by use of a preset difference value in place of said difference when the amounts of electric charges are greater than the threshold value.

13. The spatial information detector as set forth in claim 7, further comprising a saturation determiner configured to compare a predetermined threshold value with amounts of electric charges collected in each of said two different phase periods of said modulation signal over a storing time period corresponding to a plurality of cycles of said modulation signal, and an output regulator configured to regulate an electric output corresponding to an intensity of received light by changing the storing time period according to a comparison result.

14. The spatial information detector as set forth in claim 7, further comprising a saturation determiner configured to compare a predetermined threshold value with amounts of electric charges collected in each of said two different phase periods of said modulation signal over one cycle of said modulation signal, and an output regulator configured to regulate an electric output corresponding to an intensity of received light by changing a duration of at least one of said two different phase periods according to a comparison result.

15. The spatial information detector as set forth in claim 1, further comprising an amplitude-image generator configured to generate an amplitude image having pixel values, each of which is provided by said difference, and a gray-image generator configured to generate a gray image having pixel values, each of which is provided by one of amounts of electric charges collected in one of the lighting period and the non-lighting period of the flashing light by said charge storage, and an average of the amounts of electric charges collected in both of the lighting period and the non-lighting period by said charge storage.

16. A spatial information detector, comprising:
a light source that irradiates a flashing light intensity modulated at a modulation signal having a predetermined frequency into a target space;
an image sensor comprised of a semiconductor substrate and at least two light receivers arranged on the semiconductor substrate, each of the at least two light receivers comprising:
a photoelectric converter configured to receive the flashing light from the target space to generated an electric output corresponding to an intensity of the received light;
electrodes formed on the photoelectric converter;
a charge storage induced in the photoelectric converter by a control voltage applied to all or part of the electrodes so as to collect at least part of electric charges generated in the photoelectric converter; and
a charge ejector configured to output the electric charges from the charge storage; and
a microcomputer comprising a control circuit and an evaluator, said control circuit being configured:
to generate each control voltage;
to adjust a ratio of the electric charges collected in the charge storage;
to adjust a timing of forming the charge storage; and
to adjust a timing of outputting the electric charges from the charge ejector;
said evaluator being configured to detect spatial information from the target space,
wherein said evaluator is configured to evaluate the target space by use of a difference between the electric charges collected in a lighting period of said flashing light by said charge storage formed in a first photoelectric converter, and the electric charges collected in a non-lighting period of said flashing light by said charge storage formed in a second photoelectric converter.

* * * * *